United States Patent
Beveridge et al.

(10) Patent No.: US 10,262,866 B2
(45) Date of Patent: Apr. 16, 2019

(54) INDIUM PHOSPHIDE SMOOTHING AND CHEMICAL MECHANICAL PLANARIZATION PROCESSES

(71) Applicants: International Business Machines Corporation, Armonk, NY (US); JSR CORPORATION, Tokyo (JP)

(72) Inventors: Henry A. Beveridge, Beacon, NY (US); Tatsuyoshi Kawamoto, Mie (JP); Mahadevaiyer Krishnan, Hopewell Junction, NY (US); Yohei Oishi, White Plains, NY (US); Dinesh Kumar Penigalapati, Guilderland, NY (US); Rachel S. Steiner, New York, NY (US); James A. Tornello, Cortlandt Manor, NY (US); Tatsuya Yamanaka, Mie (JP)

(73) Assignees: International Business Machines Corporation, Armonk, NY (US); JSR CORPORATION, Tokyo (JP)

( * ) Notice: Subject to any disclaimer, the term of this patent is extended or adjusted under 35 U.S.C. 154(b) by 20 days.

(21) Appl. No.: 15/882,452

(22) Filed: Jan. 29, 2018

(65) Prior Publication Data
US 2018/0166292 A1 Jun. 14, 2018

Related U.S. Application Data

(62) Division of application No. 15/160,118, filed on May 20, 2016, now Pat. No. 9,916,985.
(Continued)

(51) Int. Cl.
*H01L 21/30* (2006.01)
*C09G 1/02* (2006.01)
(Continued)

(52) U.S. Cl.
CPC ........ *H01L 21/30625* (2013.01); *C09G 1/02* (2013.01); *H01L 21/0262* (2013.01);
(Continued)

(58) Field of Classification Search
CPC ........ H01J 37/32522; H01J 2237/022; H01L 21/31116; H01L 21/32115;
(Continued)

(56) References Cited

U.S. PATENT DOCUMENTS 5,972,073 A 10/1999 Sturgill et al.
7,361,526 B2 4/2008 Maa et al.
(Continued)

OTHER PUBLICATIONS

Wang, L., et al., "The impact of polishing on germanium-on-insulator substrates", Journal of Semiconductors, Aug. 2013, pp. 083005-1 to 083005-5, vol. 34, No. 8.
(Continued)

*Primary Examiner* — Brian Turner
(74) *Attorney, Agent, or Firm* — Scully, Scott, Murphy & Presser, P.C.; L. Jeffrey Kelly, Esq.

(57) ABSTRACT

A chemical mechanical planarization for indium phosphide material is provided in which at least one opening is formed within a dielectric layer located on a substrate. An indium phosphide material is epitaxially grown within the at least one opening of the dielectric layer which extends above a topmost surface of the dielectric layer. The indium phosphide material is planarized using at least one slurry composition to form coplanar surfaces of the indium phosphide material and the dielectric layer, where a slurry composition of the at least one slurry composition polishes the indium phosphide material selective to the topmost surface of the dielectric layer, and includes an abrasive, at least one pH modulator and an oxidizer, the at least one pH modulator including an acidic pH modulator, but lacks a basic pH
(Continued)

modulator, and where the oxidizer suppresses generation of phosphine gas.

11 Claims, 13 Drawing Sheets

Related U.S. Application Data

(60) Provisional application No. 62/241,388, filed on Oct. 14, 2015.

(51) Int. Cl.
 *H01L 21/02* (2006.01)
 *H01L 21/306* (2006.01)
(52) U.S. Cl.
 CPC .. *H01L 21/02381* (2013.01); *H01L 21/02433* (2013.01); *H01L 21/02543* (2013.01); *H01L 21/02636* (2013.01); *H01L 21/02639* (2013.01); *H01L 21/02647* (2013.01); *H01L 21/30612* (2013.01)
(58) Field of Classification Search
 CPC ........... H01L 21/32135; H01L 21/7684; H01L 21/67034; H01L 21/67051; H01L 21/6708; H01L 21/76819; H01L 21/32136
 See application file for complete search history.

(56) References Cited

U.S. PATENT DOCUMENTS

| | | | |
|---|---|---|---|
| 8,304,345 | B2 | 11/2012 | Martinez et al. |
| 8,338,301 | B1 | 12/2012 | Han et al. |
| 8,481,341 | B2 | 7/2013 | Clark |
| 8,969,204 | B2 | 3/2015 | Kim et al. |
| 8,981,427 | B2 | 3/2015 | Hydrick et al. |
| 9,029,908 | B2 | 5/2015 | Lochtefeld |
| 9,070,399 | B2 | 6/2015 | Hamaguchi et al. |
| 2003/0077995 | A1* | 4/2003 | Li ..................... B24B 37/044 451/528 |
| 2005/0106848 | A1 | 5/2005 | Bailey, III et al. |
| 2007/0075041 | A1 | 4/2007 | Ishibashi et al. |
| 2008/0277378 | A1 | 11/2008 | Babu et al. |
| 2009/0098807 | A1* | 4/2009 | Bakshi ................. C09G 1/02 451/36 |
| 2009/0101625 | A1* | 4/2009 | Bakshi ................. B82Y 30/00 216/38 |
| 2010/0012976 | A1 | 1/2010 | Hydrick et al. |
| 2010/0164106 | A1 | 7/2010 | Lee et al. |
| 2011/0221039 | A1 | 9/2011 | Singh |
| 2012/0199876 | A1 | 8/2012 | Bai et al. |
| 2013/0115721 | A1 | 5/2013 | Clark |
| 2013/0295752 | A1 | 11/2013 | Huang |
| 2014/0110626 | A1* | 4/2014 | Shi ..................... C09K 3/1409 252/79.1 |
| 2014/0170852 | A1 | 6/2014 | Noller et al. |
| 2014/0199841 | A1 | 7/2014 | Noller et al. |
| 2015/0099361 | A1 | 4/2015 | Franz et al. |
| 2015/0129795 | A1 | 5/2015 | Hsu et al. |
| 2015/0155181 | A1 | 6/2015 | Wang et al. |
| 2015/0175845 | A1 | 6/2015 | Li et al. |
| 2015/0184028 | A1 | 7/2015 | Jung |
| 2015/0206796 | A1 | 7/2015 | Dasgupta et al. |
| 2015/0380258 | A1 | 12/2015 | Liu et al. |
| 2016/0002500 | A1* | 1/2016 | Ito ..................... C09G 1/00 252/79.1 |

OTHER PUBLICATIONS

Waldron, N., et al., "Integration of InGaAs Channel n-MOS Devices on 200mm Si Wafers Using the Aspect-Ratio-Trapping Technique", ECS Transactions, Apr. 2012, pp. 115-128, 45, (4).

Peddeti, S., et al., "Chemical Mechanical Polishing of InP", ECS Journal of Solid State Science and Technology, Published Aug. 24, 2012, pp. P184-P189, 1 (4).

Mouton, A., et al., "Etching of InP by H3PO4 , H2O2 Solutions", Japanese Journal of Applied Physics, Oct. 1990, pp. 1912-1913, vol. 29, No. 10.

Matovu, J. B., et al., "Use of Multifunctional Carboxylic Acids and Hydrogen Peroxide to Improve Surface Quality and Minimize Phosphine Evolution During Chemical Mechanical Polishing of Indium Phosphide Surfaces", Industrial & Engineering Chemistry Research, Publication Date (Web): Jul. 8, 2013, pp. 10664-10672, 52, (31).

Li, J. Z. et al., "Defect reduction of GaAs/Si epitaxy by aspect ratio trapping", Journal of Applied Physics, published online May 19, 2008, pp. 106102-1 to 106102-3, 103.

Iwai, H., "Roadmap for 22 nm and beyond (Invited Paper)", Microelectronic Engineering, Jul. 2009, pp. 1520-1528, vol. 86, Issue 7-9.

Fiorenza, J. G. et al., "Aspect Ratio Trapping: A Unique Technology for Integrating Ge and III-VS with Silicon CMOS", ECS Transactions, Oct. 2010, pp. 963-976, 33, (6).

Dennard , R. H., et al., "Design of ion-implanted MOSFET's with very small physical dimensions", Proceedings of the IEEE, Apr. 1999, pp. 668-678, vol. 87, No. 4.

Del Alamo, J. A., "Nanometre-scale electronics with III-V compound semiconductors", Nature, Nov. 17, 2011, pp. 317-323, vol. 479.

Chau, R., et al., "Integrated nanoelectronics for the future", Nature Materials, Nov. 2007, pp. 810-812, vol. 6.

Cai, Y., et al., "Chemical Mechanical Polishing of Selective Epitaxial Grown Germanium on Silicon", ECS Journal of Solid State Science and Technology, Published Nov. 7, 2013, pp. P5-P9, 3, (2).

Hydrick, J. M., et al., "Chemical Mechanical Polishing of Epitaxial Germanium on SiO2-patterned Si(001) Substrates", ECS Transactions, Oct. 2008, pp. 237-248, vol. 16, Issue 10.

Ong, P., et al., "Ge- and III/V-CMP for Integration of High Mobility Channel Materials", ECS Transactions, Mar. 2011, pp. 647-652, vol. 34, Issue 1.

Goley, P. S., et al., "Germanium Based Field-Effect Transistors: Challenges and Opportunities", Materials, Published: Mar. 19, 2014, pp. 2301-2339, 7, (3).

Lee, M. L., et al., "Strained Si, SiGe, and Ge channels for high-mobility metal-oxide-semiconductor field-effect transistors", Journal of Applied Physics, Published online Dec. 9, 1994, pp. 011101-1 to 011101-27, 97, (1).

Currie, M. T., et al., "Controlling threading dislocation densities in Ge on Si using graded SiGe layers and Chemical-mechanical polishing", Applied Physics Letters, Apr. 6, 1998, pp. 1718-1720, vol. 72, No. 14.

Pillarisetty, R., "Academic and industry research progress in germanium nanodevices", Nature, Nov. 17, 2011, pp. 324-328, vol. 479.

Daix, N., et al., "Towards large size substrates for III-V co-integration made by direct wafer bonding on Si", APL Materials 2, published online Aug. 25, 2014, pp. 086104-1 to 086104-6.

List of IBM Patents or Patent Applications Treated as Related Dated Jan. 29, 2018, 2 Pages.

* cited by examiner

INDIUM PHOSPHIDE SMOOTHING AND CHEMICAL MECHANICAL PLANARIZATION PROCESSES

BACKGROUND

The present application relates to a semiconductor structure and a method for fabricating the same. More particularly, the present application relates to slurry compositions and a method for planarizing an indium phosphide material which can be used, for instance, in fabrication of semiconductor structures, such as, n-type MOSFETs (NFET) devices.

As the density of semiconductor integrated circuits increases and the corresponding size of circuit elements decreases, one of the key strategies to increase performance at lower operating voltages is to increase carrier mobility in the channel region. By way of an example, the carrier mobility in the channel region may be enhanced, for instance, by employing non-silicon, high mobility charge carrier material such as, for example, germanium or a III-V compound semiconductor material, in the fabrication of the channel region. For instance, high electron mobility materials, such as, for example, III-V semiconductor materials are utilized for fabricating n-type MOSFET (PFET) devices. These III-V semiconductor materials which may be, or include, materials such as, indium phosphide (InP), gallium arsenide (GaAs), InGaAs, InAs, GaSb, and InSb exhibit outstanding electron transport properties with bulk mobility of $10^4$ $cm^2$ $V^{-1}$ $s^{-1}$ or higher.

The fabrication of indium phosphide on a semiconductor substrate, such as, a silicon wafer, disadvantageously, leads to several issues such as, for instance, defect densities, owing to a high lattice mismatch of indium phosphide and a silicon wafer. Aspect ratio trapping is one way to overcome the lattice mismatch which, for instance, includes trapping threading dislocations of the indium phosphide material along the sidewalls of the dielectric layer disposed over the semiconductor substrate, such as, for instance, a silicon substrate. This results in a portion of the indium phosphide material that extends above the dielectric layer, and is subsequently planarized using chemical mechanical planarization (CMP) processes.

Enhancements in CMP processing techniques and slurry compositions employed therein continue to be desired for enhanced performance, while minimizing surface and subsurface damage.

BRIEF SUMMARY

A method for chemical mechanical planarization is disclosed in which an indium phosphide material that extends above a topmost surface of a dielectric layer present on a substrate is planarized to form coplanar surfaces of the indium phosphide material and the dielectric layer. The indium phosphide material has a first lattice constant, and the substrate includes a semiconductor material having a second lattice constant that is less than the first lattice constant of the indium phosphide material. The method includes epitaxial growth of an indium phosphide material within one or more openings, i.e., trenches, of the dielectric layer. The epitaxially grown indium phosphide material has a lower region having a first defect density within the openings, an upper region having a second defect density that is less than the first defect density, and an overburden portion that extends above the topmost surface of the dielectric layer. The overburden portion of the indium phosphide material that extends above the topmost surface of the dielectric layer is planarized using at least one slurry composition. In the present application, each slurry composition of the at least one slurry composition has a different removal rate selectivity towards the indium phosphide material and the dielectric layer. In one aspect, the slurry composition of the at least one slurry composition may include an abrasive, at least one pH modulator, and an oxidizer. In the slurry composition, the at least one pH modulator may include an acidic pH modulator, and it may lack a basic pH modulator. Further, the oxidizer present in the slurry composition suppresses generation of phosphine gas, and thereby enhances a rate of removal of the indium phosphide material, relative to a rate of removal of the dielectric layer. In another embodiment, an additional slurry composition of the at least one slurry composition may include an abrasive, at least one pH modulator, and an oxidizer, where the oxidizer suppresses generation of phosphine gas. In this aspect, the at least one pH modulator includes at least one of an acidic pH modulator and a basic pH modulator. In such an example, the additional slurry composition has an enhanced indium phosphide removal rate, and thus may reduce overburden and planarizes an initial topography of the indium phosphide material, prior to the planarization of the indium phosphide material with the slurry composition. This planarization process with the additional slurry composition may leave a planarized indium phosphide material extended above the topmost surface of the dielectric layer, which can be removed using the slurry composition mentioned above.

In one embodiment, a method for chemical mechanical planarization of indium phosphide is provided in which a dielectric layer containing at least one opening is formed above a substrate. An indium phosphide material which includes a portion that extends above a topmost surface of the dielectric layer is epitaxially grown within the at least one opening of the dielectric layer. The indium phosphide material is planarized using at least one slurry composition to form coplanar surfaces of a remaining portion of the indium phosphide material and the dielectric layer. The method, for instance, may further include a slurry composition of the at least one slurry composition that polishes the indium phosphide material selective to the topmost surface of the dielectric layer, and may include an abrasive, at least one pH modulator and an oxidizer, with the at least one pH modulator including an acidic pH modulator, but lacking a basic pH modulator, and where the oxidizer suppresses generation of phosphine gas.

In another aspect of the present application, a slurry composition for planarizing indium phosphide material is provided that includes a slurry composition including an abrasive, at least one pH modulator, and an oxidizer. In such implementation, the at least one pH modulator includes at least one of an acidic pH modulator and a basic pH modulator. Further, the oxidizer present in the slurry composition may, in some embodiments, suppress generation of phosphine gas.

In yet another aspect of the present application, a slurry composition for planarizing indium phosphide material is provided that includes a slurry composition including an abrasive, at least one pH modulator, and an oxidizer. In such implementation, the at least one pH modulator includes an acidic pH modulator, and lacks a basic pH modulator. Further, the oxidizer present in the slurry composition may, in some embodiments, suppress generation of phosphine gas.

DETAILED DESCRIPTION

Figure 1:
FIG. 1 is a cross-sectional view of one embodiment of a structure that includes a dielectric layer disposed over a substrate, in accordance with one or more aspects of the present application.

Aspects of the present application and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the application in details. It should be understood, however, that the detailed description and the specific examples, while indicating embodiments of the invention, are given by way of illustration only, and not by way of limitation. Various substitutions, modifications, additions and/or arrangements within the spirit and/or scope of the underlying inventive concepts will be apparent to those skilled in the art from this disclosure. Furthermore, reference is made below to the drawings, which are not drawn to scale for ease of understanding, wherein the same reference numbers used throughout different figures designate the same or similar components.

Integration of different semiconductor materials having different lattice constants is one challenging aspect of forming high performance devices of future technology nodes. Aspect ratio trapping (ART) is one way to overcome the lattice mismatch which, for instance, includes trapping threading dislocations of a semiconductor material such as, for example, an indium phosphide material, along the sidewalls of a dielectric layer disposed over a semiconductor substrate. In conventional ART processing, the aspect ratio trapping typically includes forming one or more openings, i.e., trenches, having an aspect ratio (opening depth to opening width) of 1:2 within the dielectric layer. A semiconductor material having a different lattice constant than the underlying semiconductor substrate is epitaxially grown from an exposed surface of the semiconductor substrate within the openings of the dielectric layer, and along the sidewalls of the dielectric layer. This, for instance, results in varying defect density regions of the semiconductor material being located within the openings. For example, a lower portion of the semiconductor material within the opening may have a first defect density, while an upper portion of the semiconductor material may have a second defect density that is less than the first defect density. The upper portion of the semiconductor material may extend above a topmost surface of the dielectric layer. The present application provides an enhanced method for CMP processing of the semiconductor material that is formed above the topmost surface of the dielectric layer.

In one embodiment of the present application, a process for facilitating chemical mechanical planarization of an indium phosphide material is provided. The process includes first providing a dielectric layer having one or more openings formed therein and located on a substrate. Next, an indium phosphide material is epitaxially grown within the one or more openings of the dielectric layer disposed over a substrate. The indium phosphide material includes a portion that extends above the dielectric layer; the portion of the indium phosphide material that extends above the dielectric layer can be referred to herein as an overburden portion. Planarization of the indium phosphide material is then performed using a slurry composition that includes an abrasive, at least one pH modulator having an acidic pH modulator, but lacking a basic pH modulator, and an oxidizer. The planarization process results in forming a remaining portion of the indium phosphide material that has a topmost surface that is coplanar with a topmost surface of the dielectric layer. The planarization process of the present application may further include planarizing the indium phosphide material, prior to the planarizing with the slurry composition, with an additional slurry composition leaving a planarized indium phosphide material extended above the dielectric layer. In some embodiments, a final surface cleaning may be employed to remove remaining first and the second slurry particles and rinse off other chemicals.

By way of example, FIGS. 1-5 depict one embodiment of a method and one or more slurry composition(s) to planarize the indium phosphide material that extends above the topmost surface of the dielectric layer, and to form a remaining indium phosphide material in which the topmost surface thereof is coplanar surface with a topmost surface of the dielectric layer, in accordance with one or more aspects of the present application.

Referring first to FIG. 1, there is illustrated a structure 200 that includes a dielectric layer 204 disposed over a substrate 202. The structure 200 may include a dielectric layer 204 disposed over, and located on, a substrate. As depicted, substrate 202 may be (in one example) a bulk semiconductor material such as, a bulk silicon wafer, having a first lattice constant. By way of example, the substrate may include a single crystalline silicon material with any suitable crystallographic orientation. For instance, the crystallographic orientation of the silicon substrate may be {100}, {110} or {111} orientations. In another example, the substrate 202 may be any silicon-containing substrate including, but not limited to, silicon (Si), polycrystalline Si, amorphous Si or the like. Although not depicted in the figures, substrate 202 may further include a layered semiconductor structure such as, for example, silicon-on-nothing (SON), silicon-on-insulator (SOI), silicon indium phosphide-on-insulator (SiGeOI), germanium-on-insulator (GOI), silicon-on replacement insulator (SRI) or the like. Substrate 202 may in addition or instead include various isolation structures or regions, nanowire structures, dopant regions and/or device features.

The dielectric layer 204, which has been disposed over the substrate 202, may be, or include, a dielectric material such as, an oxide material, (e.g., silicon dioxide, tetraethyl orthosilicate (TEOS), a high density plasma (HDP) oxide, a low temperature oxide, a high aspect ratio process (HARP) oxide or the like), a nitride material (e.g., silicon nitride (SiN)) or oxynitride material (e.g., silicon oxynitride ($SiO_xN_y$)). The dielectric layer 204 may be deposited using conventional deposition processes such as, for instance, chemical vapor deposition (CVD), plasma-enhanced chemical vapor deposition (PECVD), low-pressure chemical vapor deposition (LPCVD) or rapid thermal chemical vapor deposition (RTCVD). In one example, the dielectric layer 204 may have thickness within a range from 100 nm to 500 nm. Other thickness that are lesser than, or greater than, the aforementioned thickness range may also be employed in the present application as the thickness of the dielectric layer 204.

Figure 2A:
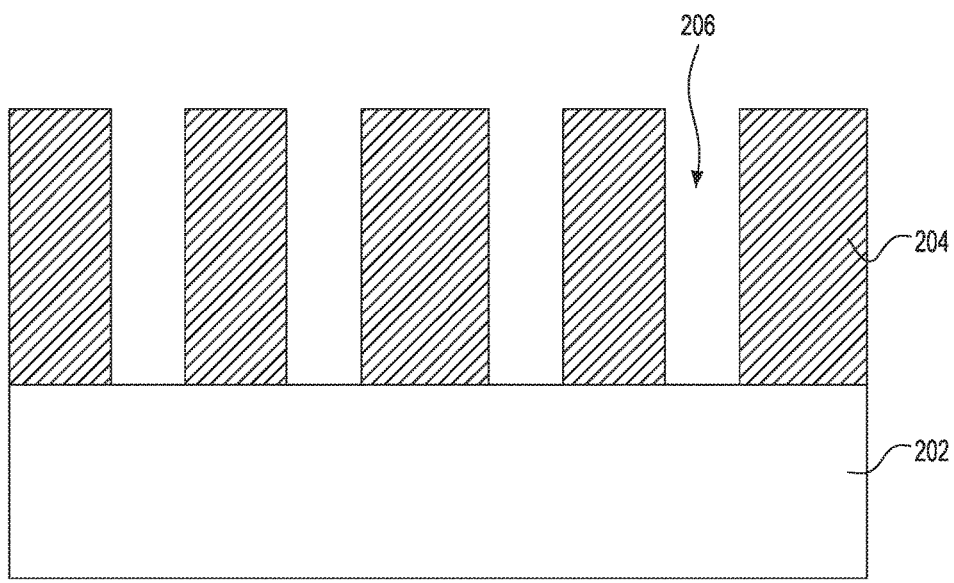
FIG. 2A depicts the structure of FIG. 1 after forming one or more openings within the dielectric layer, in accordance with one or more aspects of the present application.
Figure 2B:
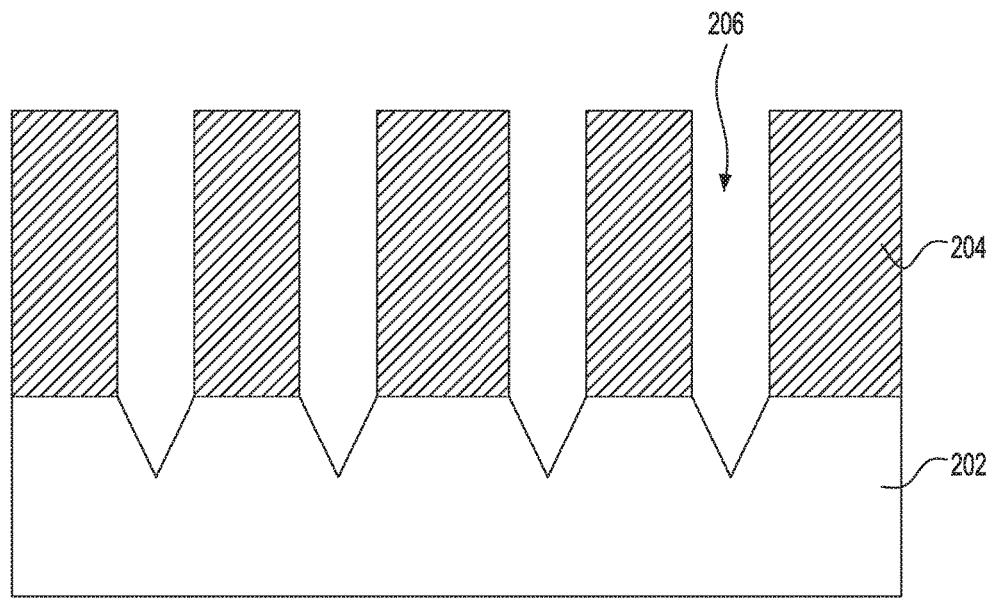
FIG. 2B depicts an alternative embodiment of the structure of FIG. 1 after forming one or more openings within the dielectric layer, in accordance with one or more aspects of the present application.

One or more patterning processes may be performed to form one or more openings 206 within the dielectric layer 204, as depicted in FIGS. 2A and 2B. As illustrated in FIG. 2A, the openings 206 extend down from a topmost surface of the dielectric layer 204 exposing a portion of the underlying substrate 202. In another embodiment in FIG. 2B, the opening 206 may extend below the surface of the substrate 202 creating a cavity within the substrate 202. The bottom wall of the cavity may be pointed (as shown) or planar (not shown). In one embodiment, the patterning process used to define each opening 206 may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. After etching, the patterned photoresist can be removed utilizing any photoresist stripping process such as, for example, ashing.

In another embodiment, the patterning process used to define each opening 206 may include a sidewall image transfer (SIT) process. In yet another embodiment, the patterning process used to define each opening 206 may include a direct self-assembly (DSA) patterning process.

In an alternative embodiment of the present application, the exemplary semiconductor structure shown in FIG. 2 can be formed by first providing a plurality of semiconductor fins (not shown) extending upwards from a semiconductor substrate utilizing one of the above mentioned patterning processes. Next, a dielectric material that provides the dielectric layer 204 is formed between each semiconductor fin and thereafter a planarization process such as, for example, chemical mechanical polishing (CMP) may be employed. Each semiconductor fin is then removed utilizing an etch to form the openings 204. The etch may include hydrochloric (HCl) gas. A cavity can be formed within the substrate 202 utilizing an etch such as a crystallographic etch.

Figure 3:
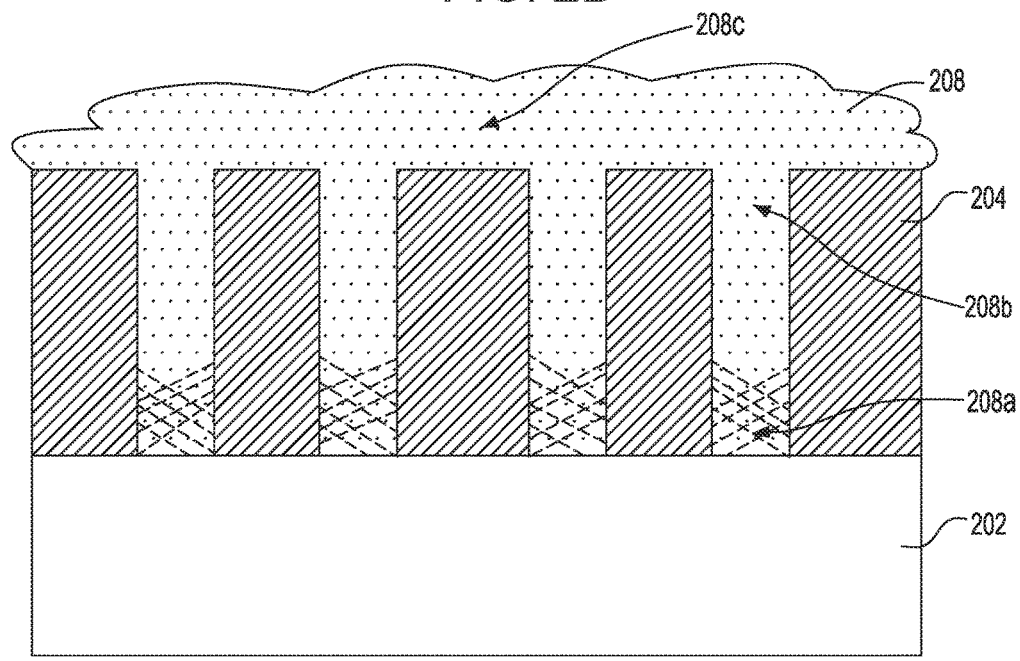
FIG. 3 depicts the structure of FIG. 2A after epitaxially growing an indium phosphide material in each of the opening(s) which extends above a topmost surface of the dielectric layer, in accordance with one or more aspects of the present application.

Referring now to FIG. 3, there is illustrated the structure of FIG. 2A after epitaxially growing an indium phosphide material 208 in each of the opening(s) 206 of the dielectric layer 204. In one embodiment, the indium phosphide material 208 can be epitaxially grown from an exposed portion of substrate 202 within the opening(s) 206 using any suitable epitaxial deposition process such as, for instance, atmospheric pressure CVD (APCVD), low- (or reduced) pressure CVD (LPCVD), ultra-high-vacuum CVD (UHCVD), by molecular beam epitaxy (MBE), metal-organic CVD (MOCVD) or by atomic layer deposition (ALD). For instance, the indium phosphide material 208 may be epitaxial grown using metalorganic CVD (MOCVD) process, for instance, by introducing an indium-containing precursor, such as, for instance, an organoindium compound (e.g., trimethyl indium, triethyl indium and/or tributyl indium), and a phosphide source such as, for instance, phosphine gas, into a reaction chamber of an MOCVD apparatus. The epitaxial growth process of the indium phosphide material 208 proceeds upwards from the exposed surface of substrate 202 and extends above the topmost surface of the dielectric layer 204. As used herein, "epitaxially growing/growth" refers to the orderly growth of the indium phosphide material over the exposed portion of the substrate 202, where the grown material arranges itself in the same crystal orientation as the underlying semiconductor material. The indium phosphide material 208 that is formed has a lattice constant that is greater than the lattice constant of the substrate 202. The indium phosphide material 208 that is formed thus has a varying defect density within the openings 206. For instance, the epitaxial growth process provides an indium phosphide material 208 that contains a lower portion 208a having a first defect density, and an upper portion 208b having a second defect density, wherein the second defect density is less than the first defect density. In some embodiments of the present application, threading dislocations within the lower portion 208a of the indium phosphide material 208 are trapped along the sidewalls of the dielectric layer 204 in a lower portion of the openings 206. The epitaxial growth process further proceeds to form an overburden portion 208c that extends above the topmost surface of the dielectric layer 204. The defect density within the overburden 208c can be the same as, or less than, the second defect density. The thickness of the overburden region 208c may be sufficient to allow subsequent planarization of the structure and, in one example, may be within a range from 100 nm to 5 µm.

Figure 4:
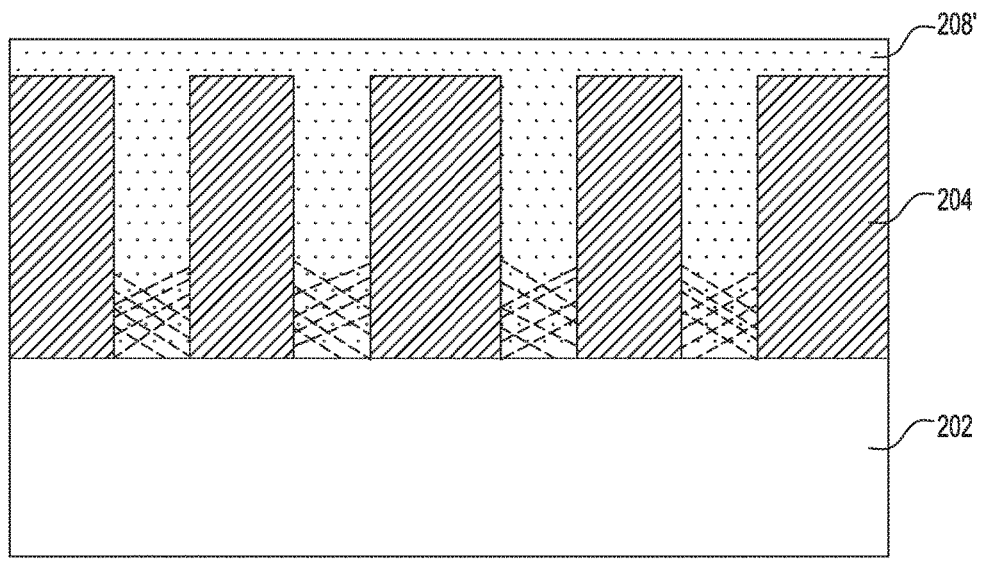
FIG. 4 depicts the structure of FIG. 3 with a planarized indium phosphide material having been formed above the topmost surface of the dielectric layer, in accordance with one or more aspects of the present application.

One or more chemical mechanical planarization processes may be employed to planarize the overburden portion 208c of the indium phosphide material 208 that extends above the topmost surface of the dielectric layer 204. By way of example, the CMP processing may be performed using, for instance, one or more slurry compositions, each slurry composition having a different removal rate selectivity towards the indium phosphide material 208 and the dielectric layer 204. As used herein, the first slurry composition refers to the additional slurry composition, and the second slurry composition refers to the slurry composition mentioned herein. In some embodiments, the CMP processing of the present application facilitates selectively planarizing the overburden portion 208c of the indium phosphide material 208, without affecting the remaining upper and lower portions of the indium phosphide material 208 located within the openings 206. Further, the overburden portion 208c of the indium phosphide material 208 may have an extremely rough surface, necessitating the first slurry composition to have an enhanced indium phosphide removal rate so as to reduce the overburden of the indium phosphide material 208 and planarize the initial topography, leaving, at least in part, a planarized indium phosphide material 208' extending above the topmost surface of the dielectric layer 204, as depicted in FIG. 4. In one embodiment, the enhanced indium phosphide removal rate of the first slurry composition may be within a range of 3000 Å/min to 5000 Å/min. In one embodiment, and since the first slurry composition only reduces the overburden and planarizes the initial topography, without exposing the underlying dielectric layer 204, a removal selectivity of the slurry composition towards the indium phosphide material 208 and the dielectric layer 204 may not be critical. In one example, a first slurry composition may be employed that is composed of, or includes, an abrasive material, one or more pH modulators, and an oxidizer. Such a first slurry composition, can be employed, in some embodiments, to form a planarized indium phosphide material 208' having a thickness from about 1000 Å to 2500 Å. In one embodiment, the oxidizer utilized in the first slurry composition may facilitate suppressing the generation of phosphine gas during the planarization processes described herein, thereby enhancing the rate of removal of indium phosphide extended above the dielectric layer 204. For instance, the oxidizers described herein react with the toxic phosphine gas to form soluble salts which, in turn, may increase the rate of removal of the indium phosphide material.

By way of example, the abrasive particles of the first slurry composition may include one or more inorganic particles and/or organic particles. In one embodiment, each abrasive particle may have an average particle diameter of from 5 nm to 500 nm, or from 10 nm to 200 nm, as determined by conventional laser light scattering techniques. The abrasive particles, in one embodiment, may be present in the first slurry composition in an amount in the range of 0.5 to 30 percent by weight, or in the range of 1 to 10 percent by weight. In one embodiment, the inorganic particles may include, for instance, silica, alumina, titania, zirconia, ceria, and the like. Examples of the silica include, but are not limited to, fumed silica, silica synthesized by a sol-gel method, colloidal silica, or the like. In one example, the fumed silica may be obtained by reacting silicon chloride or the like, with oxygen and water in an aqueous phase. In another example, the silica synthesized by a sol-gel method may be obtained by hydrolysis and/or condensation of an alkoxysilicon compound which may be used as a raw material. In yet another example, the colloidal silica may be obtained utilizing a conventional inorganic colloid method. In another embodiment, the organic particles may include, but are not limited to, polyvinyl chloride, a styrene (co) polymer, polyacetal, polyester, polyamide, polycarbonate, an olefin (co)polymer, a phenoxy resin, an acrylic (co) polymer, or the like. In one example, the olefin (co)polymer may include, for instance, polyethylene, polypropylene, poly-1-butene, poly-4-methyl-1-pentene, and the like. Examples of the acrylic (co)polymer include polymethyl methacrylate or the like. By way of example, the abrasive particles used in the first slurry composition can be selected, but are not limited to, the examples of abrasive particles provided in Table 1:

TABLE 1

| Silica Abrasive * | Particle size (DLS diameter) | | |
|---|---|---|---|
| | Primary | Secondary | Association Number |
| SCM-030B | 46.3 nm | 74.7 nm | 1.61 |
| S32-X02 | 31.5 nm | 57.0 nm | 1.81 |
| SCM-020B | 15.4 nm | 42.1 nm | 2.73 |
| SCM-070B | 46.3 nm | 74.7 nm | 1.61 |
| S32-X04 | 46.4 nm | 54.5 nm | 1.17 |
| S32-X05 | 31.6 nm | 37.7 nm | 1.19 |
| S32-X08 | 31.1 nm | 109.9 nm | 3.53 |
| S32-X09 | 30.5 nm | 64.0 nm | 2.10 |
| S32-X10 | 37.4 nm | 82.1 nm | 2.20 |
| S32-X11 | 90.0 nm | 218.0 nm | 2.42 |
| S32-X12 | 13.3 nm | 54.5 nm | 4.10 |
| S32-X13 | 14.0 nm | 17.7 nm | 1.26 |
| S32-X16 | N/A | N/A | N/A |
| S32-X17 | 57.5 nm | 63.3 nm | 1.10 |
| S32-X18 | N/A | 80 nm | N/A |
| S32-X19 | N/A | N/A | N/A |

TABLE 1-continued

| Silica Abrasive * | Particle size (DLS diameter) | | |
|---|---|---|---|
| | Primary | Secondary | Association Number |
| S32-X20 | N/A | N/A | N/A |
| S32-X103 | 12 nm | 20 nm | 1.66 |
| S32-X104 | 22 nm | 35 nm | 1.59 |
| S32-X105 | 45 nm | 80 nm | 1.78 |
| S32-X106 | 13.3 nm | 54.5 nm | 4.10 |

* All the abrasive particles listed in Table 1 are supplied by JSR Corporation.

Continuing further with FIG. 4, the first slurry composition may include, in one embodiment, one or more acidic pH modulators, and one or more basic pH modulators, which may modulate the pH of the first slurry composition to be in a range from 1 to 13, or in a range from 3 to 11. In these embodiments, the acidic pH modulators of the first slurry composition may include an inorganic acid, while the basic pH modulators of the first slurry composition may include at least one of an organic base and an inorganic base. In one example, the organic base may include, but is not limited to, tetramethylammonium hydroxide, triethylamine, N-methylethanolamine, methylamine, triethanolamine or the like. In another example, the inorganic base may include, but is not limited to, ammonium hydroxide, potassium hydroxide, sodium hydroxide, or the like. In one embodiment of the present application, the inorganic base present in the first slurry composition is within a range of 0.0001 to 0.1 percent by weight. In yet another example, the inorganic acid may include, but is not limited to, nitric acid, sulfuric acid, phosphoric acid or the like. In one embodiment of the present application, the inorganic acid present in the first slurry composition is within a range of 0.0001 to 0.1 percent by weight.

The oxidizer that is present in the first slurry composition may, in some embodiment, facilitate the suppression of the generation of phosphine gas during the planarization processes described herein. In another embodiment, the oxidizer may increase the rate of removal of indium phosphide extended above the dielectric layer 204, i.e., the overburden portion. For instance, the oxidizers described herein react with the toxic phosphine gas to form soluble salts which, in turn, increase the rate of removal of the indium phosphide material. In one example, the oxidizer includes, but is not limited to, ceric ammonium nitrate, ferric nitrate, sodium persulfate, potassium persulfate, hydrogen peroxide, and potassium permanganate or the like. By way of an example, the oxidizer present in the first slurry composition may be within the range of 0.5 to 200 mL/L, or within a range of 10 to 100 mL/L.

Still further, the first slurry composition may include one or more of the following optional components: surfactants, additives, dispersants, polyelectrolytes, soluble polymers and molecules that adsorb onto the surface of the dielectric layers and reduce the removal rate. For instance, these molecules may adsorb onto the abrasive colloid surface and may improve colloidal stability and may enhance shelf life of the first slurry composition. Additionally, the surfactants may also facilitate removal of the abrasive particles from the wafer surface during the CMP processing. In one example, the surfactant is an anionic surfactant which may include, but is not limited to, a surfactant containing at least one functional group selected from a carboxyl group (—COOX), a sulfonic acid group (—SO$_3$X), and a phosphate group (—HPO$_4$X) (wherein X represents hydrogen, ammonium, or a metal). In another example, the anionic surfactant may include, but is not limited to, aliphatic and aromatic sulfates and sulfonates, and a phosphate salt, or the like. Still further, the anionic surfactants may also include compounds such as, for instance, potassium dodecylbenzenesulfonate, ammonium dodecylbenzenesulfonate, sodium alkylnaphthalenesulphonate, alkyl sulfosuccinate, potassium alkenylsuccinate, or the like, as well as aliphatic soaps like potassium oleate or the like. These anionic surfactants may be used either individually or in combination. In another aspect, the surfactant is a nonionic surfactant which may include, but is limited to, a polyoxyethylene alkyl ether, an ethylene oxide-propylene oxide block copolymer, acetylene glycol, an ethylene oxide addition product of acetylene glycol, an acetylene alcohol, or the like. In another example, a nonionic polymer compound such as polyvinyl alcohol, cyclodextrin, polyvinyl methyl ether, or hydroxyethylcellulose may also be used as the nonionic surfactant. In another embodiment, the surfactant is a cationic surfactant which may include, but is not limited to, an aliphatic amine salts, aliphatic ammonium salts, or the like. In addition, polyelectrolytes, such as, for instance, poly (acrylic acid) and their salts such as sodium, potassium and ammonium, polystyrene sulfonate, carboxymethyl cellulose, polyvinyl pyrrolidone and polyacrylamides can also be added during the polishing to control the selectivity. Other additives such as nitrogen compounds including triazoles, imines, amides and imides can also be used. In a specific example, the additives may include, but are not limited to, benzotriazole, aminotriazole, guanidine hydrochloride, urea derivatives and thioureas.

By way of example, a general formulation of the first slurry composition having a pH within a range of 1 to 12, or within a range of 2 to 6, may include:
  a) abrasive particle, such as, silica in the range of 0.5 to 30 percent by weight, or within a range of 0.1 to 10 percent by weight;
  b) an acidic pH modulator within the range of 0.0001 to 0.1 percent by weight;
  c) a basic pH modulator within the range of 0.0001 to 0.1 percent by weight;
  d) an oxidizer, such as, 30% solution of hydrogen peroxide within the range of 0.5 to 200 mL/L, or within the range of or 0.1 to 100 mL/L.

The following examples of the first slurry composition are provided to, and should not be construed as in any way limiting the scope of the application. The first slurry composition may be prepared by admixing various components, for example, abrasive particle, pH modulators, oxidizers, surfactants, additives, etc.

Example 1

The first slurry composition having a pH within a range of 2 to 6 was prepared and included:
  a) abrasive particle such as, 5% by weight of colloidal silica abrasive dispersed in water;
  b) an acidic pH modulator containing an inorganic acid, such as, for instance, phosphoric acid within a range of 0.0004 to 0.0006% by weight;
  c) a basic pH modulator containing an inorganic base, such as, for instance, potassium hydroxide within a range of 0.0005 to 0.002% by weight; and
  d) an oxidizer, such as, for instance, 30% solution of hydrogen peroxide of 10 to 100 mL/L, and more preferably, 50 mL/L.

Example 2

The first slurry composition having a pH within a range of 2 to 6 was prepared and included:
  a) abrasive particle such as, 10% by weight of colloidal silica abrasive dispersed in water;
  b) an acidic pH modulator containing an inorganic acid, such as, for instance, phosphoric acid within a range of 0.0004 to 0.0006% by weight;
  c) a basic pH modulator containing an inorganic base, such as, for instance, potassium hydroxide within a range of 0.0005 to 0.002% by weight; and
  d) an oxidizer, such as, for instance, 30% solution of hydrogen of 30 mL/L.

Example 3

The first slurry composition having a pH within a range of 2 to 6 was prepared and included:
  a) abrasive particle such as, 15% by weight of colloidal silica abrasive dispersed in water;
  b) an acidic pH modulator containing an inorganic acid, such as, for instance, phosphoric acid within a range of 0.0004 to 0.0006% by weight;
  c) a basic pH modulator containing an inorganic base, such as, for instance, potassium hydroxide within a range of 0.0005 to 0.002% by weight; and
  d) an oxidizer, such as, for instance, 30% solution of hydrogen peroxide within a range of 10 to 100 mL/L, and more preferably, 50 mL/L.

Example 4

The first slurry composition having a pH within a range of 6 to 11 was prepared and included:
  a) abrasive particle such as, 5% by weight of colloidal silica abrasive dispersed in water;
  b) an acidic pH modulator containing an inorganic acid, such as, for instance, phosphoric acid within a range of 0.0004 to 0.0006% by weight;
  c) a basic pH modulator containing an inorganic base, such as, for instance, potassium hydroxide within a range of 0.0005 to 0.002% by weight; and
  d) an oxidizer, such as, for instance, 30% solution of hydrogen peroxide within a range of 10 to 100 mL/L, and more preferably, 10 mL/L.

Figure 5:
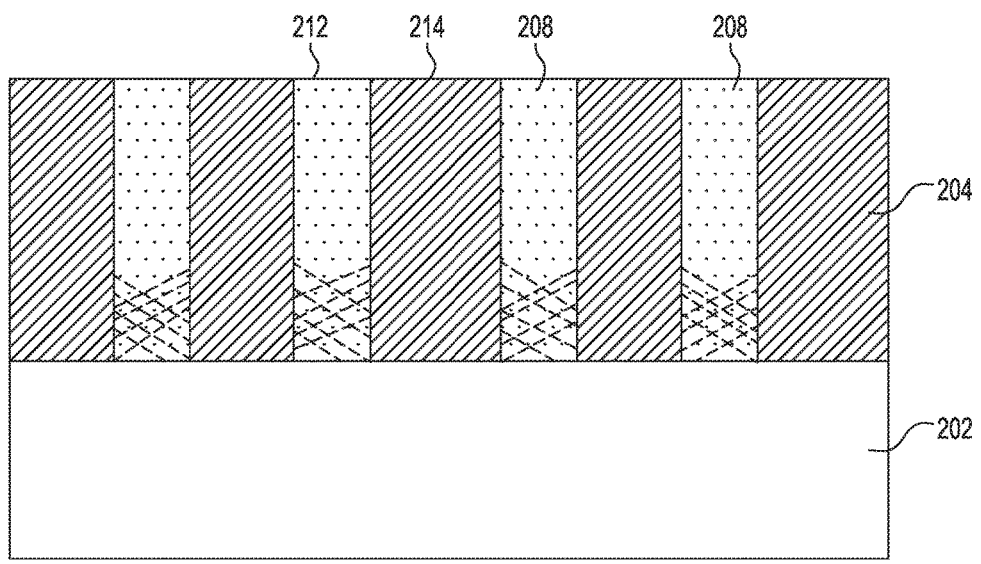
FIG. 5 depicts the structure of FIG. 4 after further planarizing the planarized indium phosphide material to form coplanar topmost surfaces of a remaining portion of the indium phosphide material and the dielectric layer, in accordance with one or more aspects of the present application.

One or more chemical planarization steps may be extended using a second slurry composition to polish the remaining planarized indium phosphide material 208' that extends above the topmost surface of the dielectric layer 204, using (in one embodiment) the topmost surface of dielectric layer 204, as a polish stop. The result is that topmost surface 212 of a remaining portion of the indium phosphide material 208 is coplanar with the topmost surface 214 of the dielectric layer 204, although height differences may exist locally, as depicted in FIG. 5. The second slurry composition may include an abrasive particle, one or more pH modulators lacking a basic pH modulator, and an oxidizer. In one embodiment, the second slurry composition has a high indium phosphide removal rate and a low dielectric material removal rate which may facilitate planarizing and/or polishing the planarized indium phosphide material 208' selective to the dielectric layer 204. In one example, the second slurry composition may have an indium phosphide removal rate of 500 Å/min to 1000 Å/min and a dielectric material removal rate of 10 Å/min to 50 Å/min. In some embodiments, this may prevent any significant erosion of the dielectric layer 204 and may enable complete removal of any residual indium phosphide extended above the topmost surface 214 of the dielectric layer 204. The first and the second slurry compositions are employed sequentially to form the coplanar surfaces of the dielectric layer 204 and the remaining portion of the indium phosphide material 208. The second slurry composition has a rate of removal of the dielectric materials (for instance, that provide the dielectric layer 204) lower than the rate of removal of the indium phosphide material. In one embodiment, the second slurry composition may be polish-resistant to at least one dielectric material that provides the dielectric layer. As used herein, "polish-resistant" refers to the one or more dielectric materials (e.g., oxide and/or nitride materials) that provide the dielectric layer being resistant to polishing and/or planarization processes described herein using the second slurry composition. In some embodiments, and when an initial topography of the overburden portion 208c of the indium phosphide material is relatively small (for instance, within a range of about 1000 Å-1500 Å), the CMP processing may be accomplished using only the second slurry composition, thereby eliminating an additional CMP processing step using the first slurry composition. As depicted, the root mean square (RMS) roughness of the remaining indium phosphide material 208, having a coplanar topmost surface with the dielectric layer 204, upon CMP processing may be, in one embodiment, less than 0.5 nm. The remaining portion of the indium phosphide material 208 has the upper portion of the second defect density and the lower portion of the first defect density; the overburden portion 208c has been removed. At this stage of the present application, and in some embodiments, the dielectric layer 204 may be partially recessed to expose an upper portion of the indium phosphide material and a semiconductor device, such as, a field effect transistor can be formed on the exposed upper portion of the indium phosphide material 208. In some embodiments, a semiconductor device may be formed directly upon the topmost surface of the remaining portion of the indium phosphide material as shown in FIG. 5.

In one embodiment, the CMP processing described herein with the first slurry composition and the second slurry composition may be accomplished using the same polishing pad. The first slurry composition and the second slurry composition can be sequentially utilized to form coplanar surfaces of the indium phosphide material and the dielectric layer, and can be applied between the polishing pad and the structure. Still further, although not depicted in the drawings, a final surface cleaning process is performed to remove any of the remaining first and the second slurry compositions and rinse off other chemicals, resulting in the resultant semiconductor structure.

By way of example, the abrasive particles of the second slurry composition may include, for instance, one or more inorganic particles and/or organic particles which, for instance, may have a particle diameter that is equal to the particle diameter of the abrasive particle used in the first slurry composition, and may be selected from any of the abrasive particles employed in the first slurry composition, described above in connection with FIG. 4. In one embodiment, the abrasive particle of the second slurry composition may be different from the abrasive particles of the first slurry composition, while the same chemistry of the first slurry composition and the second slurry composition may remain the same. In another embodiment, the abrasive particle of the second slurry composition may be the same as the abrasive particle of the first slurry composition, but the concentration of the abrasive particle of the second slurry composition may be different from the concentration of the abrasive particle of the first slurry composition. In yet another embodiment, the abrasive particle and the chemistry of the first slurry composition and the second slurry composition may be entirely different.

In one implementation, the pH modulator of the second slurry composition which, for instance, includes an acidic pH modulator, but lacks a basic pH modulator, may modulate the pH of the second slurry composition to be 3 to 5. In one example, the pH modulator of the second slurry composition may be selected from any of the inorganic acids utilized for the first slurry composition, as described above in connection with FIG. 4. For instance, the inorganic acid may include, but is not limited to, nitric acid, sulfuric acid, phosphoric acid or the like. In one embodiment, the inorganic acid present in the second slurry composition is within a range of 0.0001 to 0.1 percent by weight. In another implementation, the oxidizer of the second slurry composition may be selected from any of the oxidizer materials of the first slurry composition, described above in connection with FIG. 4. In one example, the oxidizer present in the second slurry composition may be within a range of 0.5 to 200 mL/L, or within a range of 10 to 100 mL/L. As described above, the oxidizer present in the second slurry composition may facilitate the suppression of the generation of phosphine gas during the planarization processes described herein, thereby enhancing the rate of removal of indium phosphide extended above the dielectric layer 204. For instance, the oxidizers described herein react with the toxic phosphine gas to form soluble salts or may act as accelerators and increase the rate of removal of the indium phosphide material. Additionally, the second slurry composition may also include surfactants, additives, dispersants, polyelectrolytes, soluble polymers and molecules that adsorb on to the surface of the dielectric layers and reduce the dielectric removal rate. These molecules may adsorb onto the surface of the abrasive colloidal particle, and may improve colloidal stability and may enhance the shelf life of the second slurry composition. These materials of the second slurry composition may be similar or same as the materials utilized for first slurry composition, described above in connection with FIG. 4.

By way of example, a general formulation of the second slurry composition having a pH within a range of 3 to 11, may, in one embodiment, include:
  a) Abrasive particle, such as, silica in the range of 0.5 to 30 percent by weight, or within a range of 0.5 to 10 percent by weight;
  b) An acidic pH modulator within the range of 0.0001 to 0.1 percent by weight;
  c) An oxidizer, such as, 30% solution of hydrogen peroxide within the range of 0.5 to 200 mL/L, or within the range of 10 to 100 mL/L.

The following examples of the second slurry composition are provided to further describe the invention, and should not be construed as in any way limiting the scope of the invention. The second slurry composition may be prepared by admixing various components, for example, abrasive particles, pH modulators, oxidizers, surfactants, additives, etc.

Example 1

The second slurry composition having a pH within a range of 3 to 5 was prepared and included:
  a) abrasive particle such as, 2% by weight of colloidal silica abrasive dispersed in water;
  b) an acidic pH modulator, such as, for instance, phosphoric acid within a range of 0.0004 to 0.0006% by weight; and c) an oxidizer, such as, for instance, 30% solution of hydrogen peroxide from 10 to 100 mL, and more preferably, 25 mL/L.

Example 2

The second slurry composition having a pH within a range of 3 to 5 was prepared and included:
a) abrasive particle such as, 1% by weight of colloidal silica abrasive dispersed in water;
b) an acidic pH modulator, such as, for instance, phosphoric acid within a range of 0.0004 to 0.0006% by weight; and
c) an oxidizer, such as, for instance, 30% solution of hydrogen peroxide of 50 mL/L.

Example 3

The second slurry composition having a pH within a range of 3 to 6 was prepared and included:
a) abrasive particle such as, 1% by weight of colloidal silica abrasive dispersed in water;
b) an acidic pH modulator, such as, for instance, phosphoric acid within a range of 0.0004 to 0.0006% by weight; and
c) an oxidizer, such as, for instance, 30% solution of hydrogen peroxide within a range of 10 to 100 mL/L, and more preferably, 50 mL/L; and
d) soluble polyelectrolyte such as, for instance, polystyrene sulfonate (having a molecular weight of 10,000 to 400,000) within a range of 0.01 to 0.1 percent by weight, and more preferably, 0.002 to 0.003 percent by weight.

Example 4

The second slurry composition having a pH within a range of 3 to 5 was prepared and included:
a) abrasive particle such as, 1% by weight of colloidal silica abrasive dispersed in water;
b) an acidic pH modulator, such as, for instance, phosphoric acid within a range of 0.0004 to 0.0006% by weight;
c) an oxidizer, such as, for instance, 30% solution of hydrogen peroxide within a range of 10 to 100 mL/L, and more preferably, 50 mL/L; and
d) soluble polyelectrolyte, such as, for instance, poly (acrylic acid) (having a molecular weight of 400,000) within a range of 0.01 to 0.1 percent by weight.

By way of further clarification, FIGS. 6-16 illustrate representative examples of experimental data of the first and the second slurry compositions described herein to form coplanar surfaces of the indium phosphide material and the dielectric layer, in accordance with one or more aspects of the present application. The following representative examples of the experimental data of the first and the second slurry compositions should not be construed as in any way limiting the scope of the present application.

Figure 6:
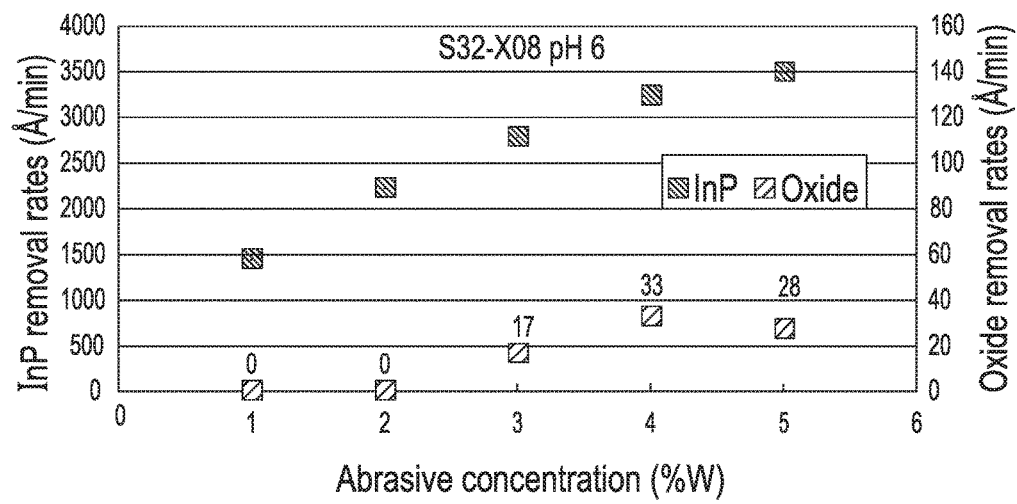
FIG. 6 depicts a representative example of the first and the second slurry compositions utilized in the forming of the coplanar surfaces of the indium phosphide material and the dielectric layer, and illustrates the rates of removal of the indium phosphide material and the dielectric material, respectively, as a function of concentration of abrasive particles, in accordance with one or more aspects of the present application.
Figure 7:
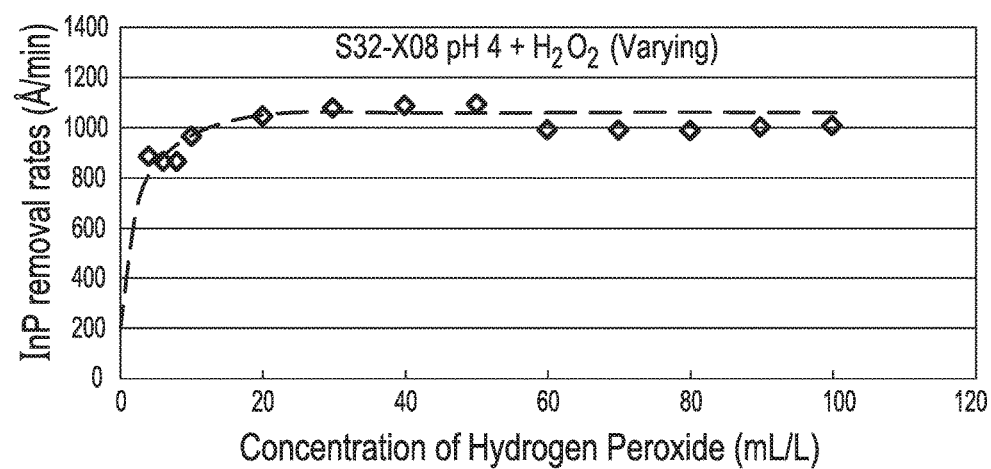
FIG. 7 depicts a representative example of the first and second slurry compositions utilized in the forming of the coplanar surfaces of the indium phosphide material and the dielectric layer, and illustrates the rate of removal of the indium phosphide material as a function of concentration of the oxidizer, in accordance with one or more aspects of the present application.
Figure 8:
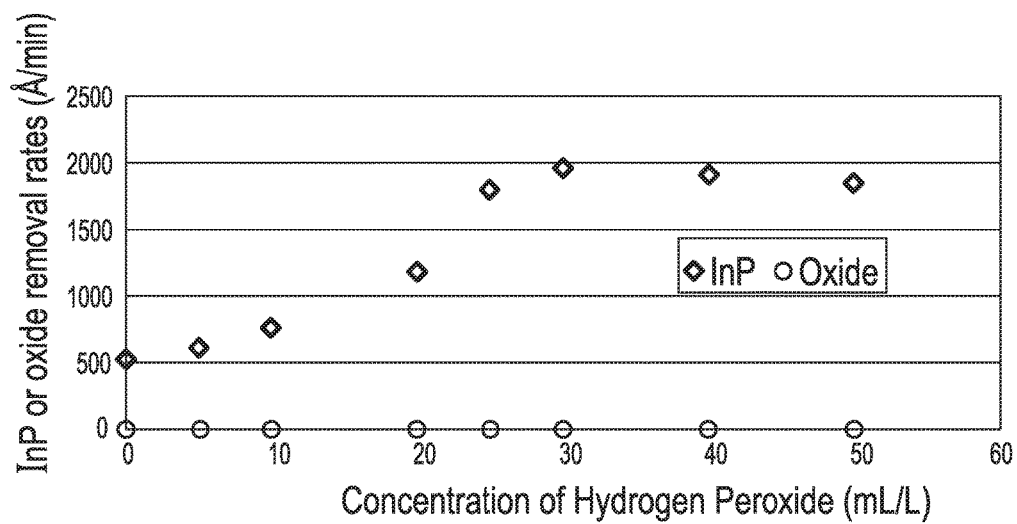
FIG. 8 depicts a representative example of the first and second slurry compositions utilized in the forming of the coplanar surfaces of the indium phosphide material and the dielectric layer, and illustrates rates of removal of the indium phosphide material and the dielectric material, respectively, as a function of concentration of the oxidizer, in accordance with one or more aspects of the present application.
Figure 9:
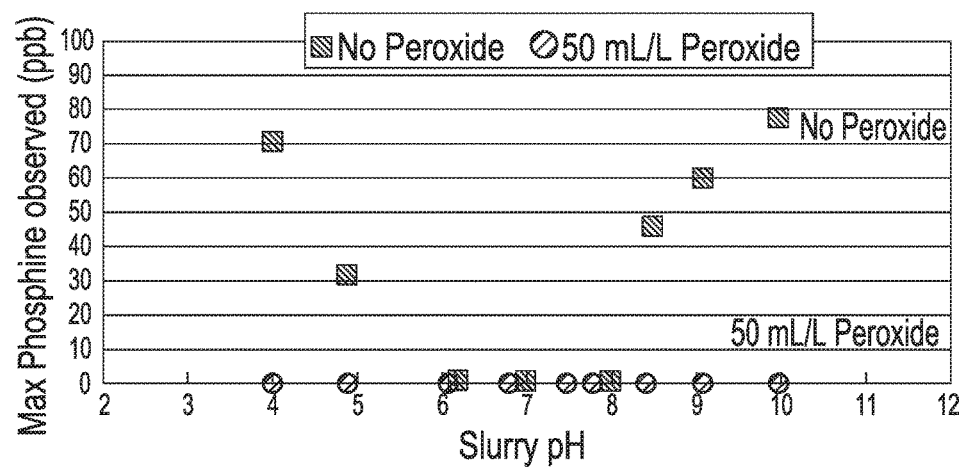
FIG. 9 depicts a representative example of the first and second slurry compositions utilized in the forming of the coplanar surfaces of the indium phosphide material and the dielectric layer, and illustrates that the presence of the oxidizer suppresses the generation of phosphine gas, in accordance with one or more aspects of the present application.
Figure 10:
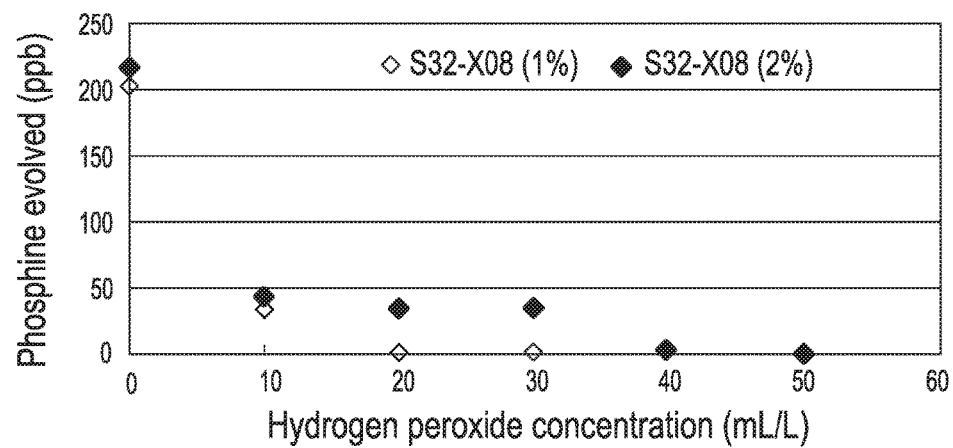
FIG. 10 depicts a representative example of the first and the second slurry compositions utilized in the forming of the coplanar surfaces of the indium phosphide material and the dielectric layer, and illustrate the effect of concentration of oxidizer on the generation of phosphine gas, in accordance with one or more aspects of the present application.

Notably, FIG. 6 depicts comparative examples of rate of removal of the indium phosphide material and rate of removal of the dielectric material as a function of concentration of abrasive particles, in accordance with one or more aspects of the present application. As evident from FIG. 6, the rate of removal of indium phosphide is greater than the rate of removal of dielectric material, such as, for instance, oxide material. In one implementation, FIG. 7 illustrates that the rate of removal of indium phosphide is a function of concentration of the oxidizer present in the first and the second slurry compositions described herein. As depicted, the oxidizer present in the first and the second slurry compositions, for instance, provides enhanced rate of removal of indium phosphide material. Further, as depicted in FIG. 8, the rate of removal of indium phosphide and rate of removal of dielectric material, such as, oxide material is a function of the concentration of oxidizer, which, for instance, facilitates tuning the rate of removal of indium phosphide material to obtain appropriate selectivity ratios between the indium phosphide material and the dielectric material. In another implementation, FIG. 9 illustrates that the addition of oxidizer in either the first or the second slurry composition facilitates suppressing the generation of phosphine gas, for instance, over the pH within a range of 4 to 10. In yet another implementation, FIG. 10 illustrates the effect of the concentration of oxidizer in either the first or the second slurry composition on the generation of phosphine gas, and as depicted, the generation of phosphine gas is suppressed with an increase in the concentration of the oxidizer.

Figure 11:
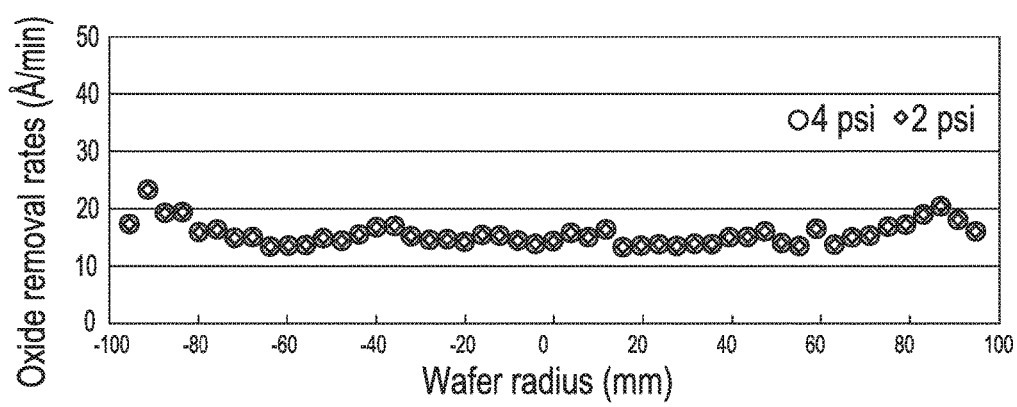
FIG. 11 depicts a representative example of the first and the second slurry compositions utilized in the forming of the coplanar surfaces of the indium phosphide material and the dielectric layer, and illustrates the rate of removal of the dielectric material and uniformity of the dielectric layer across the wafer at various applied pressure, in accordance with one or more aspects of the present application.
Figure 12:
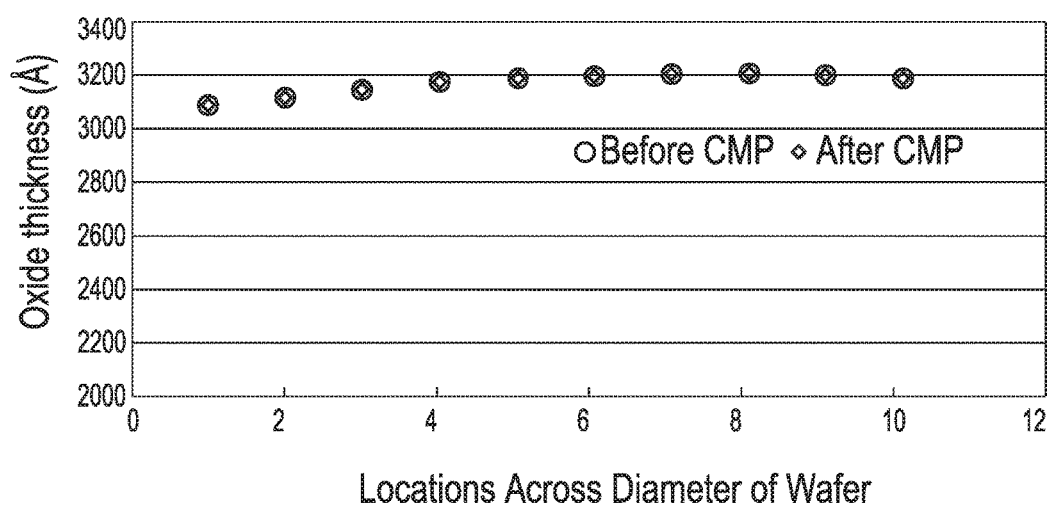
FIG. 12 depicts a representative example of the first and the second slurry compositions utilized in the forming of the coplanar surfaces of the indium phosphide material and the dielectric layer, and illustrate the thickness of the dielectric layer prior to, and subsequent to the planarization processes mentioned herein, in accordance with one or more aspects of the present application.
Figure 13:
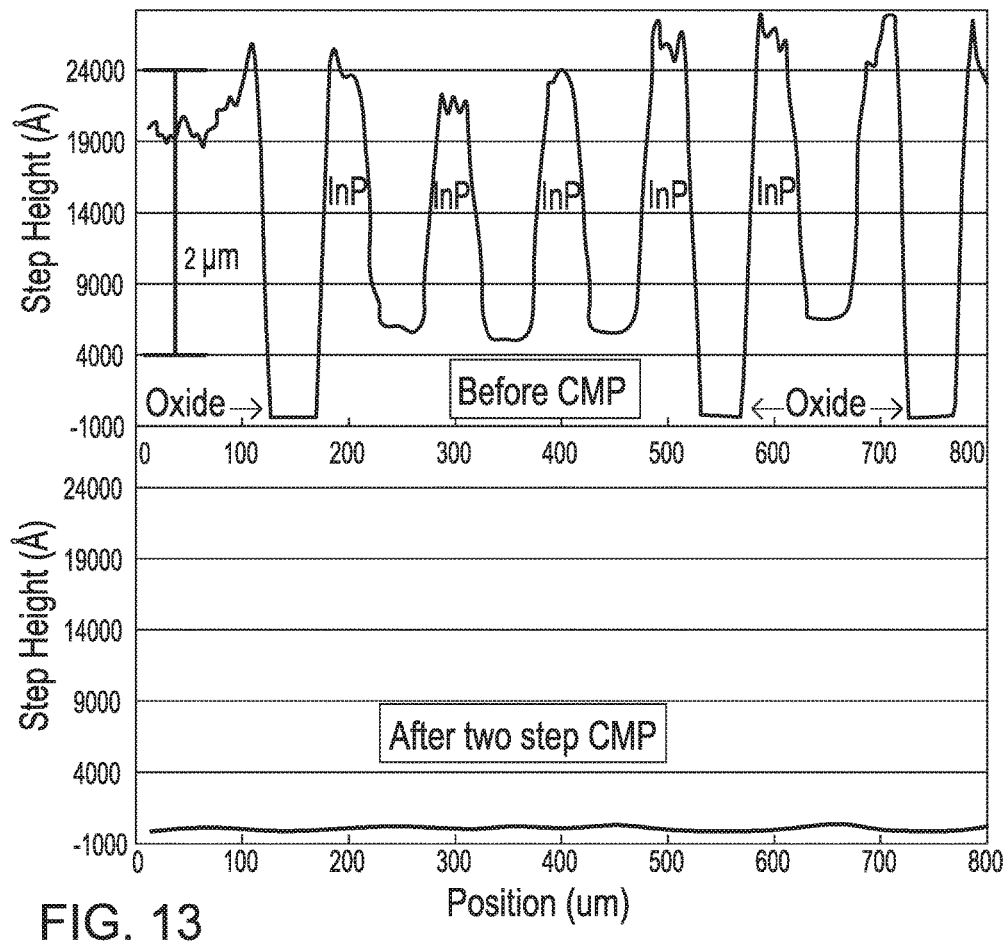
FIG. 13 depicts a representative example of the first and the second slurry compositions utilized in the forming of the coplanar surfaces of the indium phosphide material and the dielectric layer, and illustrate the profiles of a test structure containing the indium phosphide material, and the dielectric material, respectively, prior to and subsequent to the planarization processes mentioned herein, in accordance with one or more aspects of the present application.
Figure 14:
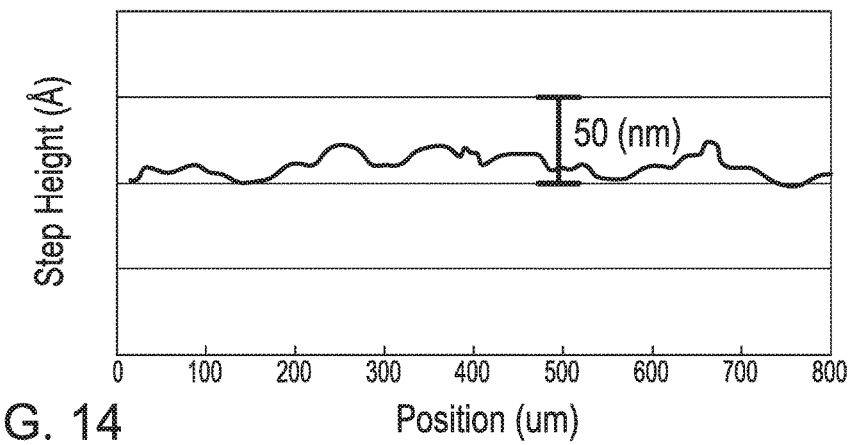
FIG. 14 depicts a representative example of the first and the second slurry compositions utilized in the forming of the coplanar surfaces of the indium phosphide material and the dielectric layer, and illustrate the final profile of the test structure in high resolution, in accordance with one or more aspects of the present application.
Figure 15:
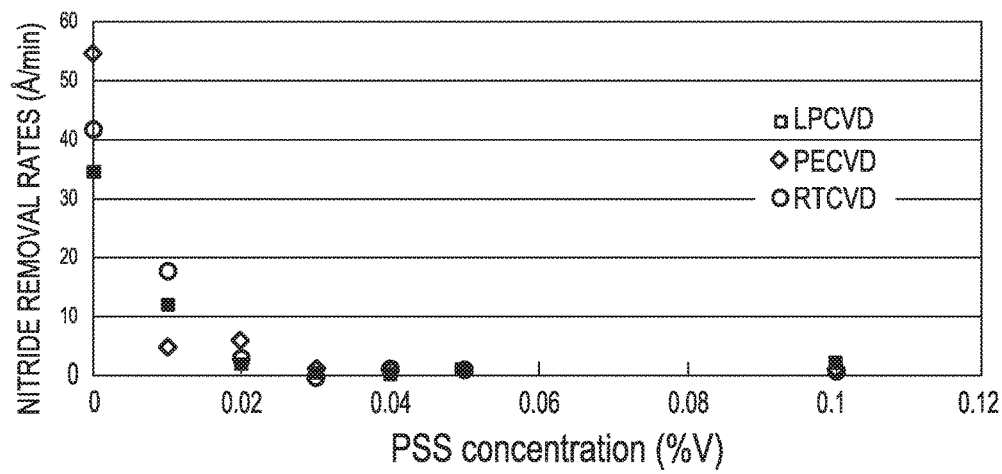
FIG. 15 depicts a representative example of the first and the second slurry compositions utilized in the forming of the coplanar surfaces of the indium phosphide material and the dielectric layer, and illustrates that polystyrene sulfonate reduces the rate of removal of the dielectric material, in accordance with one or more aspects of the present application.
Figure 16:
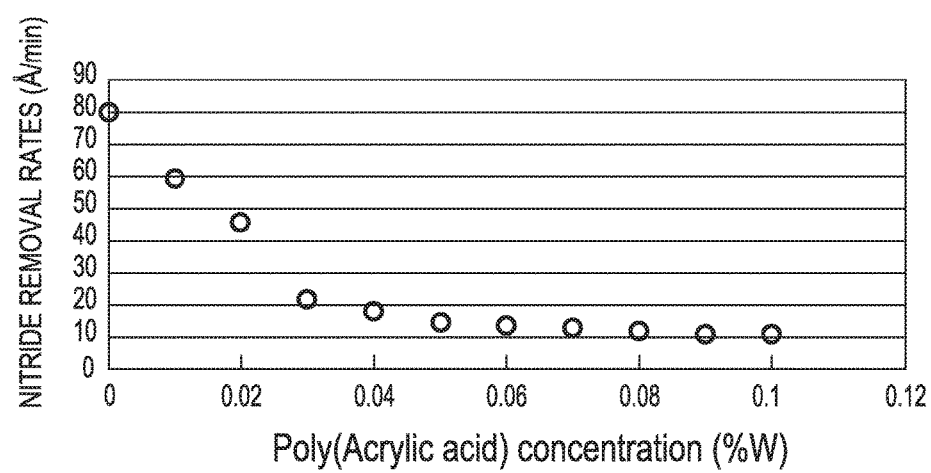
FIG. 16 depicts a representative example of the first and the second slurry compositions utilized in the forming of the coplanar surfaces of the indium phosphide material and the dielectric layer, and illustrates that poly(acrylic acid) reduces the rate of removal of the dielectric material, in accordance with one or more aspects of the present application.

By way of further explanation, FIG. 11 illustrates the rate of removal of dielectric material, such as, for instance, oxide material and uniformity of the dielectric layer across the wafer at various applied pressure, and as depicted, the rate of removal of the dielectric material is uniformly low resulting in coplanar surfaces of the dielectric layer and the indium phosphide material. FIG. 12 illustrates the thickness of the dielectric layer prior to and subsequent to the chemical mechanical planarization processes described herein, and as depicted, no loss of the dielectric material, such as, for instance, oxide material is observed. Still further, FIG. 13 depicts the profiles of a test structure containing indium phosphide and dielectric material such as, for instance, oxide material patterns prior to and subsequent to the two step planarization processes described herein, while the FIG. 14 illustrates that nearly 2.5 µm initial topography of the indium phosphide material has been reduced to less than 25 nm across a test structure of 800 µm length. Still further, FIGS. 15 and 16 illustrate comparative examples of a relation between the rate of removal of the dielectric material and the concentration of soluble polyelectrolytes, such as, for instance polystyrene sulfonate (see FIG. 15), and poly (acrylic acid) (see FIG. 16), and as evident, illustrates that the polystyrene sulfonate and poly(acrylic acid) reduces the rate of removal of the dielectric layer having, for instance, nitride material and, for instance, may serve to act as stop layers. Further, as evident, the polystyrene sulfonate and poly(acrylic acid) are water soluble polymers which, for instance, may act as surface active molecules, or adsorbates, but not as abrasive particles.

Figure 17:
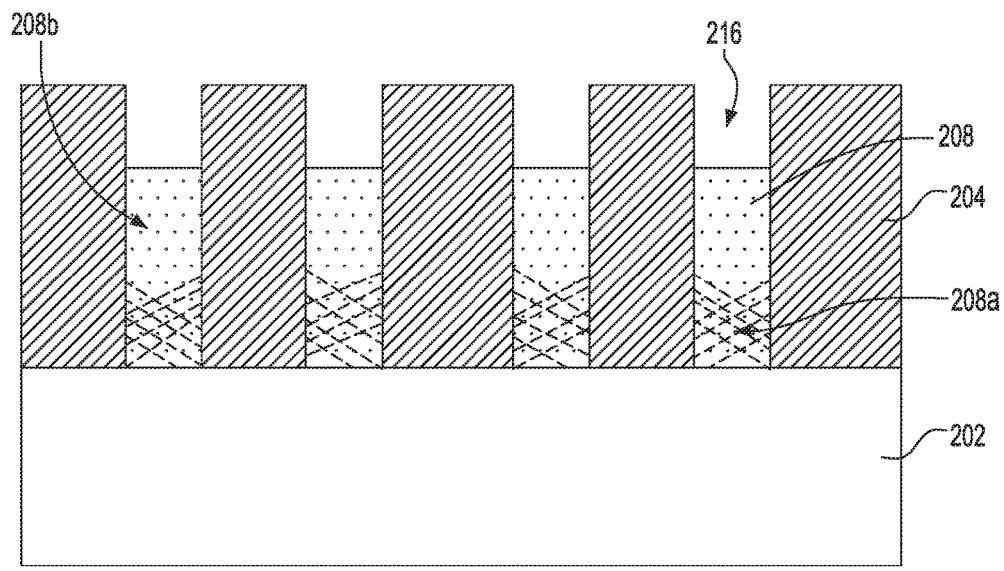
FIG. 17 depicts an alternative embodiment of the structure of FIG. 5 with the indium phosphide material having been partially etched to forming one or more trenches, in accordance with one or more aspects of the present application.

Referring now to FIG. 17, there is illustrated an alternative embodiment of the structure of FIG. 6 with the indium phosphide material 208 having been partially etched to form one or more trenches 216 within the dielectric layer 204, in accordance with one or more aspects of the present application. The indium phosphide material may be partially etched using any conventional anisotropic dry etching process, such as, a reactive ion etch, or conventional isotropic etching process, such as, a wet etch. In one example, the indium phosphide material 208 may be recessed to a depth of 10 nm to 200 nm. As depicted, the indium phosphide material being etched includes the upper portion 208b of the second defect density disposed above the lower portion 208a of the first defect density, without affecting the underlying the lower portion 208a.

Figure 18:
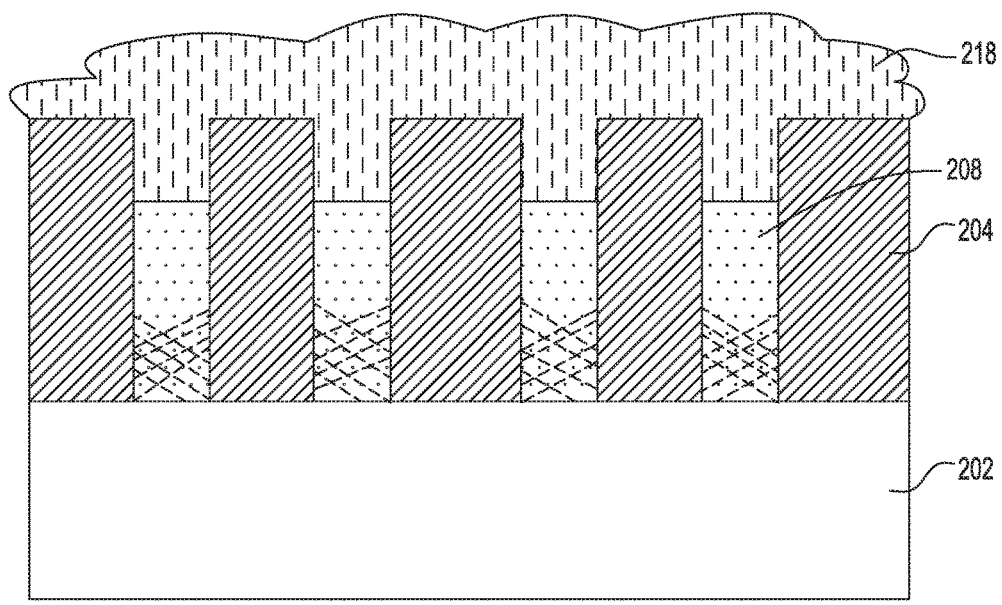
FIG. 18 depicts the structure of FIG. 17 after epitaxially growing an additional semiconductor material within the one or more trenches which, for instance, extends above the topmost surface of the dielectric layer, in accordance with one or more aspects of the present application.

Referring now to FIG. 18, there is illustrated the structure of FIG. 17 after epitaxially growing an additional semiconductor material 218 within the one or more trenches 216 which extends above the topmost surface of the dielectric layer 204. The additional semiconductor material 218 may include, or be fabricated of, a semiconductor material, such as, silicon germanium material, or a III-V compound semiconductor material other than indium phosphide material, such as, InSb, GaP, GaN, GaSb, InGaAs, InAs, GaAs, etc., having a lattice constant that is substantially similar to the lattice constant of the lower portion 208b of the indium phosphide material. The additional semiconductor material 218 may be formed by an epitaxial growth process such as described herein in the forming of the indium phosphide material 208. In one example, the additional semiconductor material, such as, silicon germanium material, may be epitaxially grown using a silicon source gas, such as, for instance, silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexmethyldisilane, and combinations thereof, and the germanium source gas, such as, for instance, germane, digermane, halogermane, dichlorogermane, trichlorogermane, tetrachlorogermane and combinations thereof. As described above, the additional semiconductor material 218 may have substantially similar crystalline characteristics as the indium phosphide material 208 disposed within the openings 206. In one embodiment, the thickness of the additional semiconductor material 218 extended above the topmost surface of the dielectric layer 204 may be sufficient to allow subsequent planarization of the structure. The additional semiconductor material 218 may be used to form the channel regions of III-V compound semiconductor material transistor devices such as, planar CMOS Field Effect Transistor (FETs) or non-planar FinFET devices to be formed, during subsequent fabrication processing.

Figure 19:
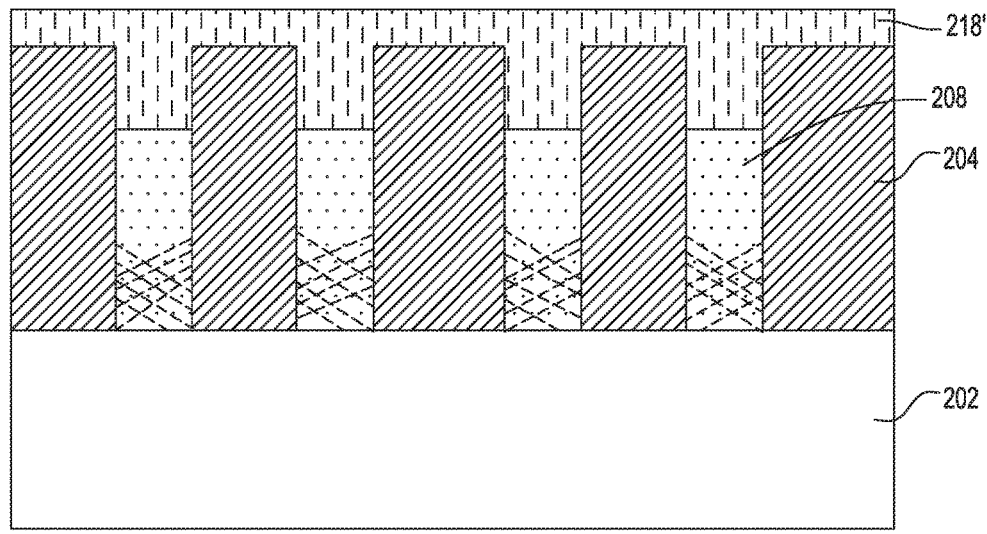
FIG. 19 depicts the structure of FIG. 18 with a planarized additional semiconductor material having been formed above the topmost surface of the dielectric layer, in accordance with one or more aspects of the present application.

One or more chemical mechanical planarization steps may be employed to planarize the additional semiconductor material 218 extended above the topmost surface of the dielectric layer 204, while the indium phosphide material 208 disposed within the openings 206 remains unaffected. The CMP processing may be performed using, for instance, the first and the second slurry compositions described above in connection with FIGS. 4 and 5. For instance, the additional semiconductor material 218 that extends above the topmost surface of the dielectric layer 204, owing to the epitaxial growth process, may have an extremely rough surface which may be planarized using the first slurry composition so as to reduce the overburden and to planarize the initial topography, leaving a planarized additional semiconductor material 218' extended above the topmost surface of the dielectric layer 204, as depicted in FIG. 19. Further, since the first slurry composition only reduces the overburden and planarizes the initial topography, without exposing the underlying dielectric layer, the removal rate selectivity of the slurry composition towards the additional semiconductor material and the dielectric layer may not be critical. As described in previous embodiment, the first slurry composition may include, for instance, an abrasive material, one or more pH modulators having an acidic pH modulator and a basic pH modulator, and an oxidizer.

The abrasive particle of the first slurry composition may include, for instance, one or more inorganic particles and/or organic particles which may have a particle diameter that is equal to the particle diameter of the abrasive particle used in the first slurry composition, and may be selected from any of the abrasive particles employed in the first slurry composition, described above in connection with FIG. 4. In one implementation, the pH modulator of the first slurry composition which, for instance, includes an acidic pH modulator and a basic pH modulator, may modulate the pH of the first slurry composition to be 3 to 11. In one example, the pH modulators of the first slurry composition may be selected from any of the pH modulators utilized for the first slurry composition, as described above in connection with FIG. 4. In one embodiment, the acidic pH modulator and the basic pH modulator present in the first slurry composition may be within a range of 0.0001 to 0.1 percent by weight. In one implementation of the present invention, the oxidizer of the first slurry composition may be selected from any of the oxidizer materials of the first slurry composition, described above in connection with FIG. 4. In one example, the oxidizer present in the first slurry composition may be within the range of 0.5 to 200 mL/L, or within a range of about 10 to 100 mL/L. Additionally, the first slurry composition may also include surfactants, additives, dispersants, polyelectrolytes, soluble polymers and molecules that adsorb on to the surface of the dielectric layers and reduce the dielectric removal rate. These molecules, for instance, may adsorb onto the abrasive colloid surface and may improve colloidal stability and may enhance the shelf life of the first slurry composition. These materials of the first slurry composition may be similar or same as the materials utilized for first slurry composition, described above in connection with FIG. 4.

Figure 20:
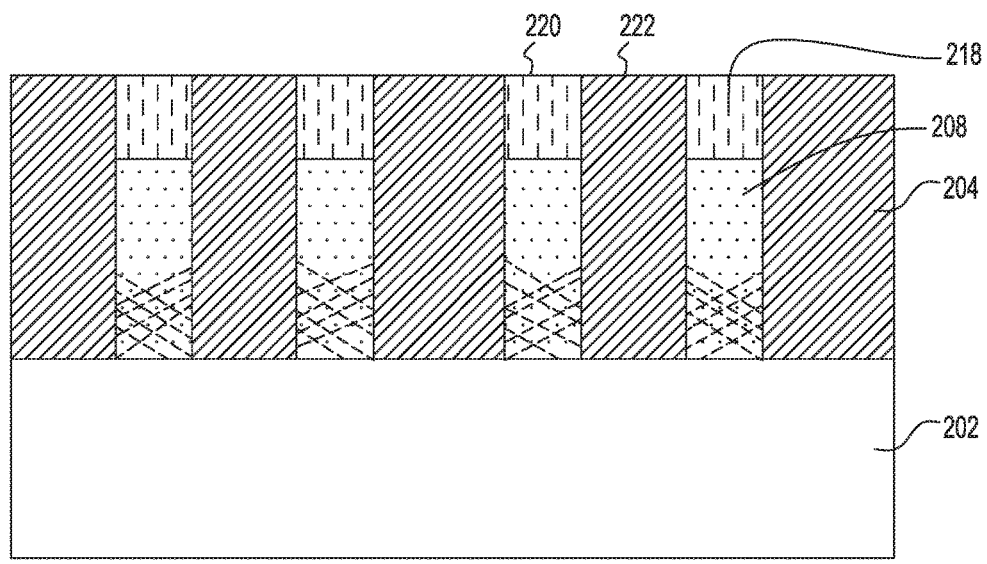
FIG. 20 depicts the structure of FIG. 19 after planarizing the additional semiconductor material to form coplanar topmost surfaces of the additional semiconductor material and the dielectric layer, in accordance with one or more aspects of the present application.

One or more chemical mechanical planarization processing may be extended using the second slurry composition of the one or more slurry compositions to polish the remaining planarized additional semiconductor material 218' extended above the dielectric layer, using the topmost surface of the dielectric layer 204, as a polish stop. The result is that topmost surface 220 of the additional semiconductor material 218 is substantially coplanar with the topmost surface 222 of the dielectric layer 204, as depicted in FIG. 20. As described in the previous embodiment, the second slurry composition may include an abrasive particle, one or more pH modulators lacking a basic pH modulator, and an oxidizer, along with the surfactants, additives, dispersants, polyelectrolytes described herein in the second slurry composition utilized in the planarization of the indium phosphide material, and the various materials of the second slurry composition may be substantially similar or the same materials of the second slurry composition described above in connection with FIG. 5. Further, as described above in the previous embodiment, the second slurry composition can have a high additional semiconductor material removal rate and a low dielectric removal rate which may facilitate planarizing and/or polishing the planarized additional semiconductor material, selective to the dielectric layer. This may prevent any significant erosion of the dielectric layer and enables complete removal of any residual additional semiconductor material 218 extended above the topmost surface 222 of the dielectric layer 204. Further, although not depicted in the drawings, a final surface cleaning process is performed to remove any of the remaining first and the second slurry compositions and rinse off other chemicals, resulting in the resultant semiconductor structure.

Figure 21:
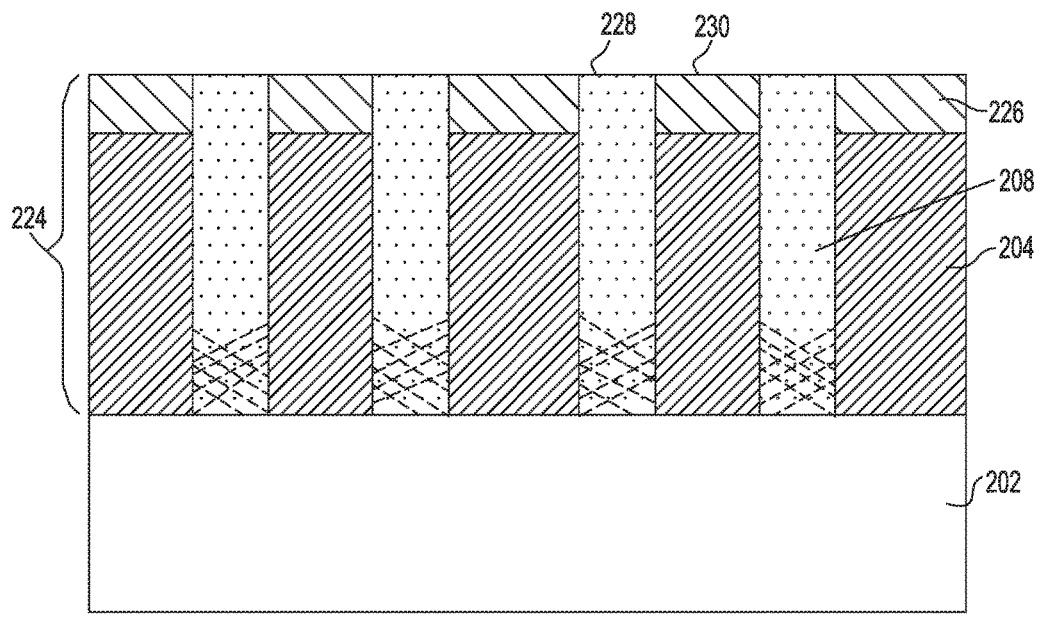
FIG. 21 depicts an alternative embodiment of the structure of FIG. 5, and includes coplanar surfaces of the indium phosphide material and a dielectric stack structure disposed over the substrate, in accordance with one or more aspects of the present application.
Figure 22:
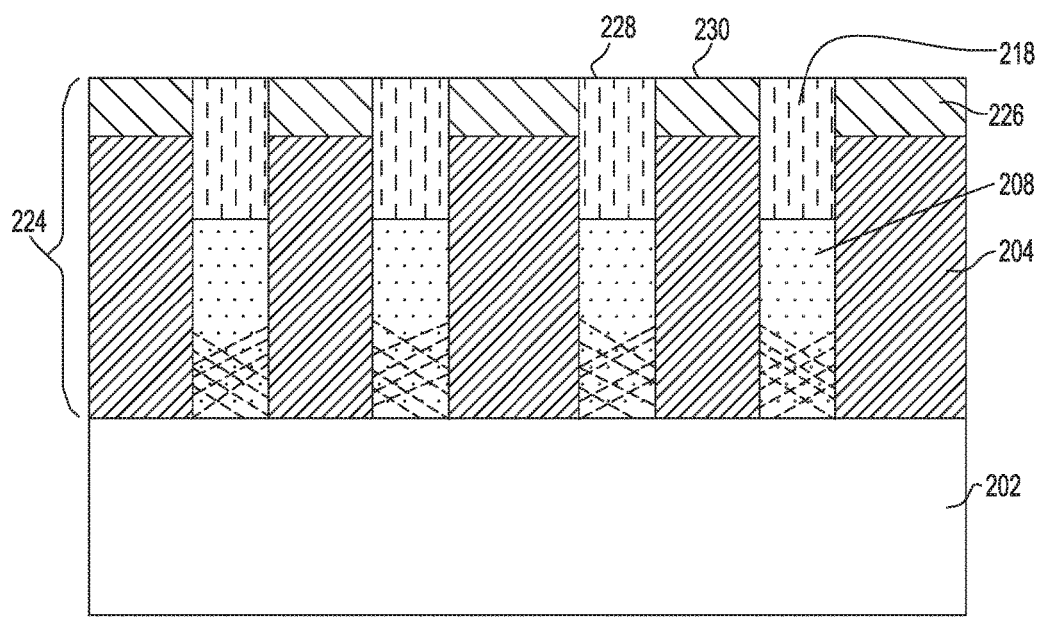
FIG. 22 depicts an alternative embodiment of the structure of FIG. 21, and includes coplanar surfaces of additional semiconductor material and a dielectric stack structure disposed over the substrate, in accordance with one or more aspects of the present application.

Referring now to FIG. 21, there is illustrated an alternative embodiment of the structure of FIG. 5, and includes coplanar surfaces of indium phosphide material 208 and a dielectric stack structure 224 disposed over the substrate 202. As illustrated in FIG. 21, the dielectric layer 204 may, in an additional or an alternative embodiment, be disposed with one or more additional dielectric layer(s) 226. In such embodiments, the dielectric layer 204 and the additional dielectric layer(s) 226 together define one example of a dielectric stack structure 224. The additional dielectric layer(s) 226 may be, or include, a dielectric material, such as, for instance, an oxide material (e.g., silicon dioxide, tetraethyl orthosilicate (TEOS), a high density plasma (HDP) oxide, a low temperature oxide, a high aspect ratio process (HARP) oxide or the like), a nitride material (e.g., silicon nitride (SiN)) or oxynitride material (e.g., silicon oxynitride (SiOxNy)) or the like, and may be deposited using any of the conventional deposition techniques described above in connection with the formation of the dielectric layer 204. The materials of the dielectric layer 204 and the additional dielectric layer 226 may be different. For instance, in one embodiment, when the dielectric layer 204 is an oxide material, the additional dielectric layer 226 can be a nitride material or vice versa, which, for instance, results in the additional dielectric layer 226 serving as a polish stop layer, during the subsequent CMP processes. Further, as illustrated in FIG. 22, a portion of the indium phosphide material 208 may be partially etched to form one or more trenches, as described above in connection with FIG. 17. An additional semiconductor material 218 which, in one example, may include, or be fabricated of a semiconductor material, such as, silicon germanium or a III-V compound semiconductor material, may be epitaxially grown within the trenches, as described above in connection with FIG. 18. As described in previous embodiments of the present application, the additional semiconductor material 218 that extends above the topmost surface of the dielectric stack structure 224, in one embodiment, is subsequently planarized using the first and the second slurry compositions described herein in the present application. The result is that the topmost surface 228 of the additional semiconductor material 218 is coplanar with the topmost surface 230 of the additional dielectric layer 226 of the dielectric stack structure 224.

Figure 23:
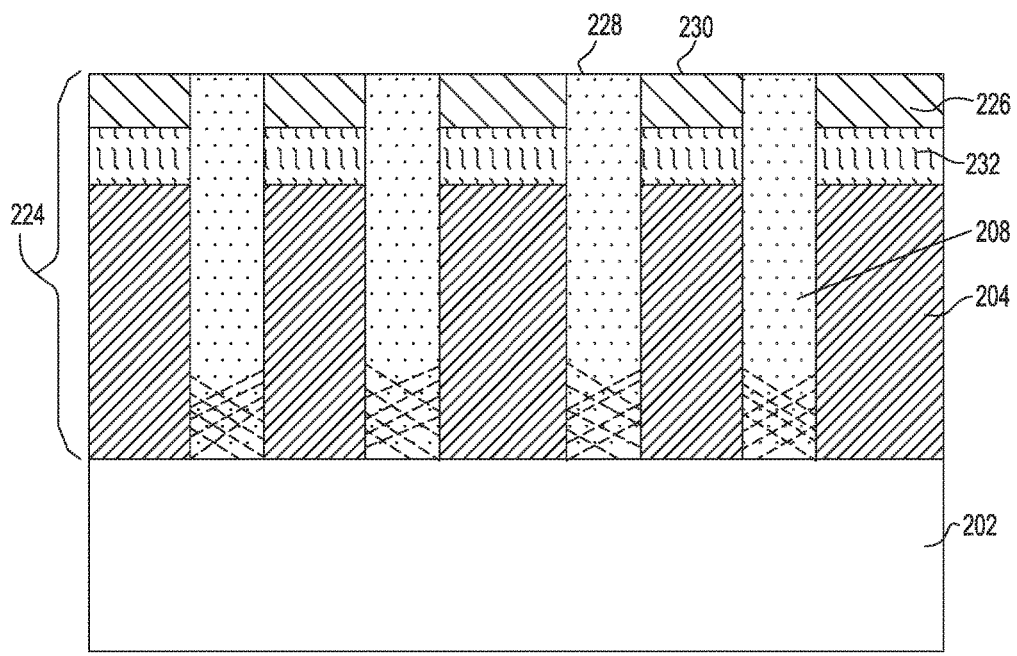
FIG. 23 depicts an alternative embodiment of the structure of FIG. 21, and includes coplanar surfaces of the indium phosphide material and a dielectric stack structure having one or more sacrificial semiconductor layer(s) disposed over the substrate, in accordance with one or more aspects of the present application.

Further, in an additional or an alternative embodiment, the dielectric stack structure 224 may also include one or more sacrificial semiconductor layer(s) 232, as depicted in FIG. 23. By way of example, the sacrificial semiconductor layer 232 may be, or include a silicon germanium material with multiple layers of varying concentrations. In such an embodiment, the additional dielectric layer 226 may serve as a protective layer so as to protect the various underlying layers of the dielectric stack structure 224. The sacrificial semiconductor layer 232 (if present), and the additional dielectric layer 226 over the sacrificial semiconductor layer 232 may be formed over the dielectric layer 204, resulting in the dielectric stack structure 224. The dielectric stack structure 224 may subsequently be patterned and etched to form one or more opening(s) (not shown) using any conventional lithographic patterning processes, as described above in connection with the formation of the opening(s) 206 in FIG. 2. The indium phosphide material 208 may be subsequently be deposited within the openings, as described in previous embodiments, and planarized using the first and/or the second slurry compositions as described in previous embodiments. As depicted further in FIG. 22, this results in the topmost surface 228 of the indium phosphide material 208 being substantially coplanar the topmost surface 230 of the additional dielectric layer 226 of the dielectric stack structure 224. Note that, as described in the previous embodiments, the one or more slurry compositions, in particular, the second slurry composition described herein has a rate of removal of the additional dielectric material (e.g., oxide and/or nitride materials) that is lower than the rate of removal of the germanium material. In one embodiment, the second slurry composition may be polish-resistant to any of the materials of the additional dielectric layer 226.

Figure 24:
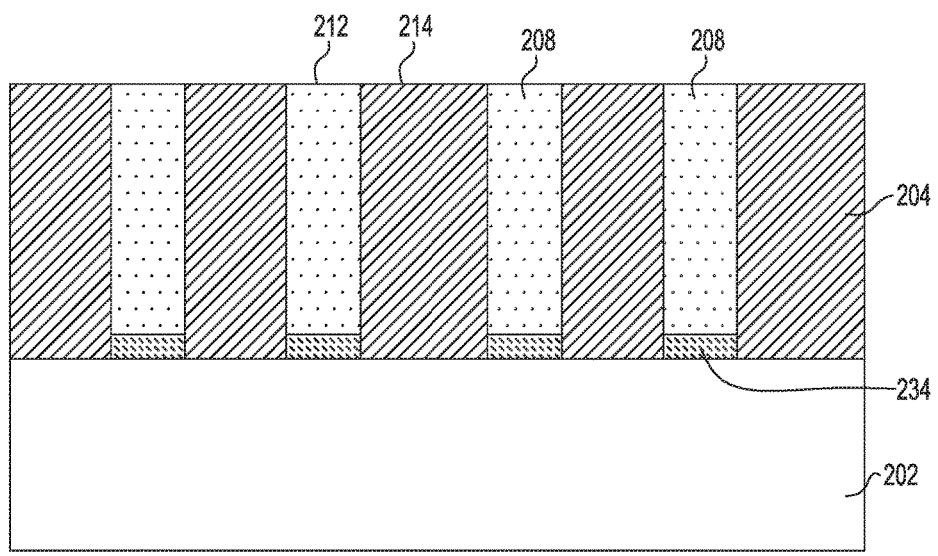
FIG. 24 depicts an alternative embodiment of the structure of FIG. 5, and includes coplanar surfaces of the indium phosphide material disposed over a buried template layer, and the dielectric layer, in accordance with one or more aspects of the present application.

Referring now to FIG. 24, there is illustrated an alternative embodiment of the structure of FIG. 5, and includes coplanar surfaces of indium phosphide material 208 disposed over a buried template layer 234, and the dielectric layer 204, in accordance with one or more aspects of the present application. By way of example, the buried template layer 234, which may be, or include, any suitable III-V template layer, may be epitaxially grown within the openings 206 of the dielectric layer, prior to the epitaxial growth of the indium phosphide layer 208. The buried template layer 234 may serve to act as a buffer layer and enable an defect-free epitaxial growth of the indium phosphide material over the exposed portions of the substrate 202. As described above in previous embodiments, the indium phosphide material 208 extends above the topmost surface of the dielectric layer which, for instance, is subsequently planarized using the first and the second slurry compositions described in the previous embodiments. The result is that the topmost surface 212 of the indium phosphide material 208 is coplanar with the topmost surface 214 of the dielectric layer 204.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the present invention for various embodiments with various modifications as are suited to the particular use contemplated.

What is claimed is:

1. A slurry composition for planarizing an indium phosphide material, the slurry composition comprising:

an abrasive, an acidic pH modulator, a basic pH modulator and an oxidizer, wherein the oxidizer is configured to suppress generation of phosphine gas.

2. The slurry composition of claim 1, further comprising a soluble polyelectrolyte.

3. The slurry composition of claim 1, wherein the slurry composition has a rate of removal for the indium phosphide material that is greater than a rate of removal for a dielectric material.

4. The slurry composition of claim 3, wherein the oxidizer of the slurry composition enhances the rate of removal of the indium phosphide material.

5. The slurry composition of claim 1, wherein the slurry composition is polish-resistant to at least one of an oxide material and a nitride material.

6. The slurry composition of claim 1, wherein the abrasive comprises inorganic particles, organic particles or a mixture of organic particles and inorganic particles.

7. The slurry composition of claim 1, wherein the abrasive comprises particles having an average particle diameter of from 5 nm to 500 nm.

8. The slurry composition of claim 1, wherein the abrasive is present in the composition in an amount from 0.5 to 30 weight percent.

9. The slurry composition of claim 1, wherein the composition has a pH from 1 to 13.

10. The slurry composition of claim 1, wherein the acidic pH modulator comprises an inorganic acid and the basic pH modulator comprises at least one of an organic base and an inorganic base.

11. The slurry composition of claim 1, wherein the oxidizer comprises ceric ammonium nitride, ferric nitrate, sodium persulfate, potassium persulfate, hydrogen peroxide or potassium permanganate.

* * * * *